(12) United States Patent
Aweya et al.

(10) Patent No.: US 8,473,638 B2
(45) Date of Patent: Jun. 25, 2013

(54) METHOD AND APPARATUS FOR TIME AND FREQUENCY TRANSFER IN COMMUNICATION NETWORKS

(76) Inventors: James Aweya, Kanata (CA); Luis Orozco Barbosa, Albacete (ES)

( * ) Notice: Subject to any disclaimer, the term of this patent is extended or adjusted under 35 U.S.C. 154(b) by 820 days.

(21) Appl. No.: 12/114,252

(22) Filed: May 2, 2008

(65) Prior Publication Data
US 2009/0276542 A1 Nov. 5, 2009

(51) Int. Cl.
G06F 1/12 (2006.01)
G06F 1/04 (2006.01)

(52) U.S. Cl.
USPC ............ 709/248; 709/203; 713/400; 713/375

(58) Field of Classification Search
USPC .......................... 709/248, 203; 713/400, 375
See application file for complete search history.

(56) References Cited

U.S. PATENT DOCUMENTS

| | | | |
|---|---|---|---|
| 6,199,170 B1* | 3/2001 | Dietrich ........................ | 713/400 |
| 6,370,161 B1 | 4/2002 | Ehrlich et al. | |
| 7,020,791 B1* | 3/2006 | Aweya et al. ................. | 713/400 |
| 7,130,368 B1* | 10/2006 | Aweya et al. ................. | 375/376 |
| 7,191,355 B1* | 3/2007 | Ouellette et al. ............. | 713/400 |
| 7,315,546 B2* | 1/2008 | Repko et al. ............. | 370/395.62 |
| 7,613,268 B2* | 11/2009 | Aweya et al. ................. | 375/376 |
| 7,656,985 B1* | 2/2010 | Aweya et al. ................. | 375/373 |
| 7,672,465 B2* | 3/2010 | Iwamura ........................ | 381/77 |
| 7,738,499 B2* | 6/2010 | Kugumiya et al. ........... | 370/503 |
| 7,747,725 B2* | 6/2010 | Williams et al. ............. | 709/223 |
| 7,860,205 B1* | 12/2010 | Aweya et al. ................. | 375/376 |
| 2003/0056136 A1* | 3/2003 | Aweya et al. ................. | 713/400 |
| 2003/0130040 A1 | 7/2003 | Dripps | |
| 2004/0071168 A1* | 4/2004 | Julyan ........................... | 370/503 |
| 2004/0264477 A1* | 12/2004 | Repko et al. ............. | 370/395.62 |
| 2006/0056323 A1 | 3/2006 | Currivan | |
| 2006/0072627 A1* | 4/2006 | Kugumiya et al. ........... | 370/503 |
| 2006/0159280 A1* | 7/2006 | Iwamura ........................ | 381/79 |
| 2006/0242445 A1* | 10/2006 | Aweya et al. ................. | 713/400 |
| 2006/0280182 A1* | 12/2006 | Williams et al. ............. | 370/394 |
| 2007/0226530 A1 | 9/2007 | Celinski et al. | |

FOREIGN PATENT DOCUMENTS

| WO | 03/036395 A1 | 5/2003 |
|---|---|---|
| WO | 2007117756 A2 | 10/2007 |

OTHER PUBLICATIONS

International Search Report and Written Opinion dated Aug. 12, 2009 for International Application No. PCT/CA2009/000583, International Filing Date May 1, 2009 consisting of 20-pages).
1st Examination Report dated Mar. 18, 2013 for Chinese National Stage Application Serial No. 200980124897.6, National Stage Entry date: Dec. 24, 2010 consisting of 8-pages in Chinese Characters.
English Translation of 1st Examination Report dated Mar. 18, 2013 for Chinese National Stage Application Serial No. 200980124897.6, National Stage Entry date: Dec. 24, 2010 consisting of 11-pages.

* cited by examiner

Primary Examiner — Kenneth R Coulter
(74) Attorney, Agent, or Firm — Christopher & Weisberg, P.A.

(57) ABSTRACT

A timing system for time synchronization between a time server and a time client over a packet network. The timing system includes a time server for generating current timestamp information and a time client having a phase-locked loop driven client clock counter. The time client periodically exchanges time transfer protocol messages with the time server over the packet network, and calculates an estimated client time based on the timestamp information. The phase-locked loop in the time client receives periodic signals representing the estimated server time as its input and calculates a signal which represents the error difference between the estimated server time and the time indicated by the time client clock counter. The error difference eventually converges to zero or a given error range indicating the time presented by the client clock counter, which is driven by the phase-locked loop having locked onto the time of the time server.

17 Claims, 9 Drawing Sheets

METHOD AND APPARATUS FOR TIME AND FREQUENCY TRANSFER IN COMMUNICATION NETWORKS

FIELD OF THE INVENTION

The present invention relates to time and frequency synchronization in packet networks and more specifically to a method and system that incorporates a time transfer protocol and phase-locked loop (PLL) architecture to address the problem of packet delay variation (PDV) in packet networks.

BACKGROUND OF THE INVENTION

With the increasing need for bandwidth, Time Division Multiplex (TDM) networks face limits in terms of scalability, operational cost and maintenance. This results in telecommunications carriers having to replace circuit-based transport with packet-based (Ethernet) transport to realize cost and operational efficiencies, meet increasing bandwidth demands from customers at reasonable price points, bring a new level of flexibility and dynamic configuration to the network, and offer more tiered and time-based or on-demand services.

Synchronization is critical in the transition from circuit-based TDM networks to packet-based networks and, in turn, the deployment of Carrier Ethernet technology. One of the technical challenges holding back the deployment of Carrier Ethernet has been the requirement for very accurate clock synchronization in the network between source and destination, which is an absolutely essential capability for delivering wireless backhaul and leased line services. Traditionally, these services have been delivered over synchronous technologies like T1/E1 and SONET/SDH. Ethernet networks, however, are asynchronous, designed originally to deliver data and without the need for accurate clock synchronization and distribution capabilities in the network.

Without proper frequency synchronization, packet networks carrying timing-sensitive services can generate excessive jitter and wander when interfacing to TDM devices. Network-wide frequency synchronization is a new requirement driven by performance measurement, service assurance and real-time services in next generation networks. Service providers need to meet timing (frequency synchronization) requirements for Circuit Emulation Services (CES) and other services over packet switched networks that isolate remote network elements from their source of synchronization. Mobile operators need to ensure they can support the synchronization accuracy needed to avoid dropped calls and maintain quality of service (QoS).

Time (i.e., time of day or wall-clock) synchronization is inherently important to the function of communication networks. It provides a common time reference for all devices (switches, routers, gateways, etc.) on the network. Without synchronized time, accurately correlating information between devices becomes difficult, if not impossible. In the area of network security, if a network engineer cannot successfully compare logs between each of the routers and all the network servers, it is very hard to develop a reliable picture of an incident.

Presently, timing in telecom networks is delivered over synchronous technologies like T1/E1, SONET/SDH, and Global Positioning Systems (GPS). As a result, carriers rely on expensive solutions such as circuit-based T1/E1 connections and GPS receivers to ensure accurate synchronization of services across packet networks. All of these existing timing methods involve considerable capital investment for hardware at a large number of customer sites or base stations. For example, a GPS receiver is installed at each base station and used as a stable clock reference for re-timing the CES packets between the CES interface and the base station T1/E1 input. The timing signal received by the base station is retimed to be precise and stable. However, the disadvantage of GPS-based re-timers is that they involve a substantial cost and implementation burden. There is the need to equip each base station with a GPS receiver, involving a significant capital cost. With several million base stations in the world, the required investment is substantial. Another concern is that the existing GPS may not be an acceptable solution for all sites since GPS signals may be weak indoors or in metropolitan areas. Moreover, some wireless operators intentionally may not want to use a GPS signal controlled by the United States.

For these reasons, telecommunications providers have been seeking alternative solutions that would eliminate these expenses. With recent technological developments, a growing possibility has come to be delivering time and frequency synchronization over the packet-based network. Such alternative synchronization solutions over packet technology enable time and frequency synchronization to be distributed across asynchronous Ethernet, IP, and MPLS packet networks. Carriers can lower their operating costs by eliminating GPS receivers and T1/E1 connections, while maintaining high-quality service for time-sensitive applications.

Many service providers have looked at Network Time Protocol (NTP), the most popular protocol for time synchronization over LANs and WANs. NTP, however, currently does not meet the accuracy requirements for telecom grade time and frequency synchronization. The problem is that NTP packets go through the Ethernet physical and Media Access Control (MAC) layers in the switches or routers like any other packets, so synchronization is not addressed until the packets reach the end-system software stack. The synchronization signals are thus delayed by a non-deterministic amount depending on the operating system latency.

Another protocol that promises high accuracy timing delivery is the IEEE 1588 Precision Time Protocol (PTP). The main obstacle to the adoption of IEEE 1588 is that the protocol cannot be seamlessly implemented in current/existing native Ethernet interface cards. Networks requiring this protocol would have to replace these cards with IEEE 1588 compliant cards. The result is the implementation of a protocol that has a cost associated with it that the network engineer may not be willing to incur.

Exact time synchronization over packet networks is difficult to achieve, particularly, when there are uncertainties on transmission delays in the network, and on processing delays in the protocol layers of the end-systems. Packet Delay Variation (PDV) is a main cause of poor clock synchronization in communication networks. PDV must be properly mitigated when transporting timing-sensitive traffic over packet networks.

What is therefore needed is a method and system that allows end-systems attempting to synchronize with a reference source to minimize the timing uncertainties, including PDV, in order to allow the end-systems to remain time and frequency synchronized with the reference source.

SUMMARY OF THE INVENTION

The present invention advantageously provides a method and system for synchronizing time and frequency between a time server and one or more time clients over a packet network. Time transfer messages are exchanged between the time server and the time client. A time transfer protocol at a client governs the receipt and utilization of timestamp information in order to identify and discard time transfer messages that experience delay variation. The protocol then calculates an estimated server time by incorporating a clock offset calculated from the remaining "clean" timestamp information. The estimated server time is periodically updated with each exchange of time transfer protocol messages. A phase-locked loop in the time client receives the estimated server time as its input and calculates a signal which represents the error difference between the estimated server time and the time indicated by a time client clock counter. The time client clock counter is initially loaded with the value of the first available estimated server time. Henceforth, after each error signal generation, an oscillator in a phase-locked loop having a frequency corresponding to the error signal, controls and updates the time client clock counter accordingly. Eventually, the error difference converges to zero or a given error range indicating the time presented by the client clock counter, which is driven by the phase-locked loop's oscillator, has locked onto the time of the time server.

In one aspect of the invention, a timing system for time synchronization over a packet network is provided. The timing system includes a time server having a server clock for generating current timestamp information, and a time client having a client clock, the time client having a time estimation mechanism and a phase-locked loop driven client clock counter. The time client periodically exchanges time transfer protocol messages with the time server over the packet network and calculates an estimated client time based on the timestamp information.

In another aspect, a method of time synchronization over a packet network between a time server having a sever clock and a time client having a client clock is provided, where the time client has a time estimation mechanism and a phase-locked loop driven clock counter. The method includes receiving transfer protocol messages from the time server over a packet network, receiving timestamp information from the time server, where the timestamp information is for use in estimating a current clock offset between the client clock and the server clock and identifying and discarding time transfer protocol messages that experience delay variation, periodically calculating an estimated server time, and calculating an estimated client time based on the estimated server time.

In yet another aspect of the invention, a timing system for time synchronization over a packet network is provided. The timing system includes a time server for generating timestamp information, the time server having a server clock, and a timing transfer node in electrical communication with the time server. The timing transfer node transmits the timestamp information in the form of time transfer protocol messages to one or more time clients over the packet network, where the one or more time clients each have a client clock. The time transfer protocol messages are periodically exchanged between the time server and the one or more time clients according to a time transfer protocol.

BRIEF DESCRIPTION OF THE DRAWINGS

A more complete understanding of the present invention, and the attendant advantages and features thereof, will be more readily understood by reference to the following detailed description when considered in conjunction with the accompanying drawings wherein.

DETAILED DESCRIPTION OF THE INVENTION

Figure 1:
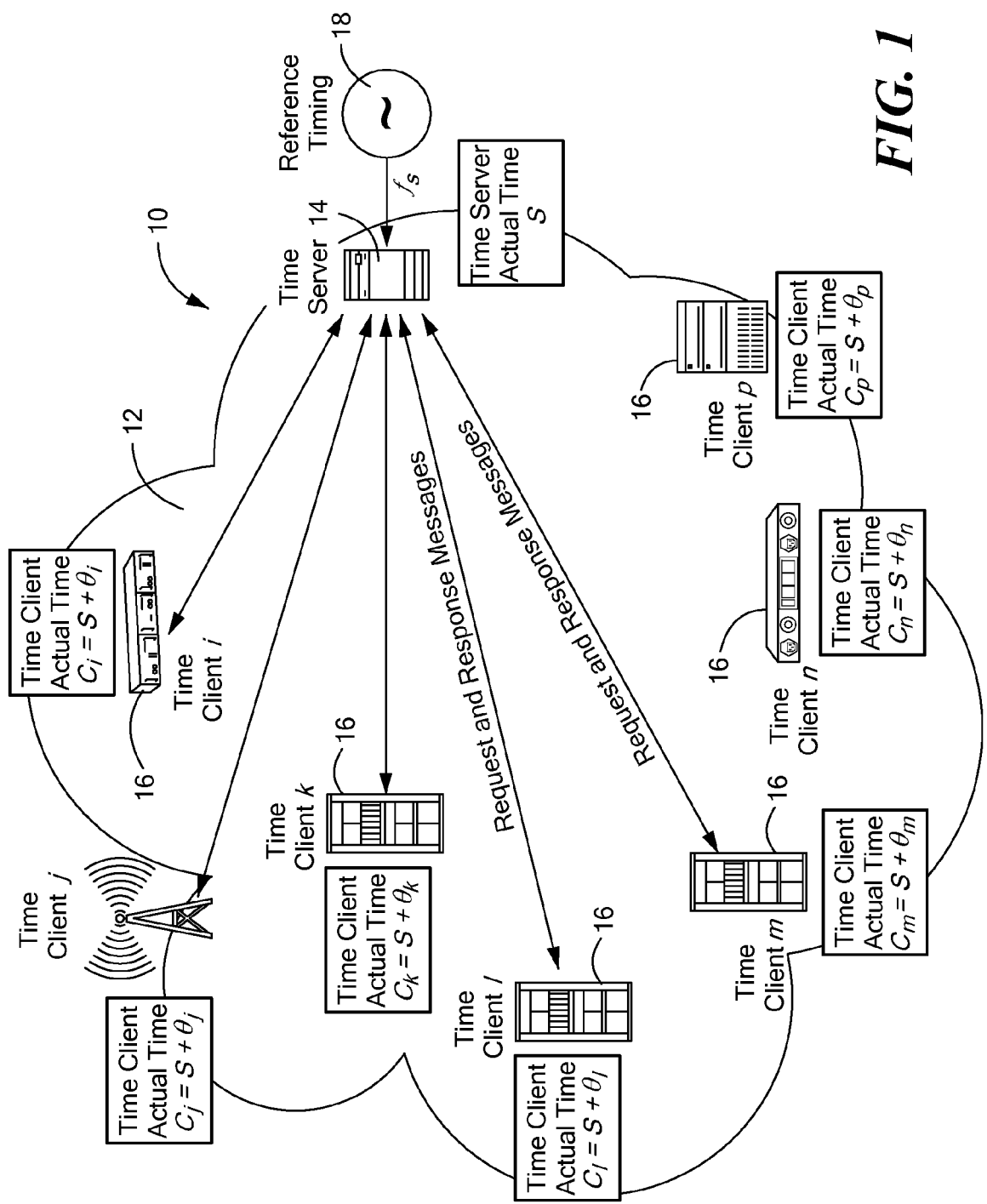
FIG. 1 is a block diagram of an exemplary wireline system architecture for time and frequency constructed in accordance with the principles of the present invention.

It is to be understood that both the preceding summary and the following detailed description are exemplary and explanatory and are intended to provide further explanation of the invention as claimed. Neither the summary nor the description that follows is intended to define or limit the scope of the invention to the particular features mentioned in the summary or in the description. The present invention provides a method and system synchronizing timing between a time server and a time client over a packet network.

The present invention can be implemented in a packet network over which time and frequency are transferred. A central timing system is provided which consists of a time server and timing transfer node (e.g., router, switch, gateway, wireless access point, etc.), and time clients (e.g., router, switch, gateway, wireless access point, desktop computer, laptop, personal digital assistant (PDA), VoIP phone, data server, etc.). The communication between a timer server and one or more time clients can be wireline or wireless. Communication between the central timing system and the time clients could be is via several networks such as Ethernet, IP, PBT, MPLS, WiFi, WiMax, etc. The reference time source could be GPS or a time server with a stable and accurate clock source such a Rubidium atomic clock. The functions of the time server are the generation of the time-critical event information and the current time information, and transmitting them to the time clients.

In one embodiment of the invention, two components, a time transfer protocol for message exchanges between a time server and a time client, and a Phase-Locked Loop (PLL)/clock architecture at the time client, are provided. The time transfer protocol allows messages to be exchanged between a time server and a time client. After each protocol exchange, the protocol engine in the client estimates the current time reference at the time server. In the protocol, timestamp information is transferred between the server and client to allow the client to identify and discard time transfer protocol messages that experienced delay variation. The protocol calculates a clock offset between server and client clocks and incorporates it in the computation of the time server's current time.

The reference input to the PLL can be the instantaneous or the filtered estimated time of the server. The PLL uses this estimated time to lock onto the server clock. The PLL has four main components: a phase detector, a loop filter, an analog controlled oscillator, and a clock counter. The phase detector computes the error signal as the difference between the estimated server current time (reference signal) and the output signal of the PLL which is the estimated client current time (PLL output). The error signal is passed on to a loop filter which is responsible for eliminating possible jitter and noise in the input signal. The filtered error is then mapped/transformed into a corresponding control signal to drive the controlled oscillator. The control signal could be voltage for a voltage controlled oscillator (VCO), or current for a current controlled oscillator (CCO). The controlled oscillator, which typically has a center frequency, oscillates at a frequency which is determined by the output signal of the loop filter.

Initially, the PLL waits for the first available server current time estimate. When the first server time is estimated it is loaded into the clock counter. From this point onward, the PLL starts to operate in a closed-loop fashion. Each time the server current time is estimated after a protocol exchange (i.e., at sampling instant), the error difference between this value and the current time indicated by the client clock counter is computed. This error term is sent to the loop filter whose output controls the frequency of the VCO. The output of the VCO in turn provides the clock frequency of the time client and also drives the clock counter. After a period of time, the error term is expected to converge to zero which indicates the PLL has been locked to the incoming time base, i.e., time base of the time server.

Figure 2:
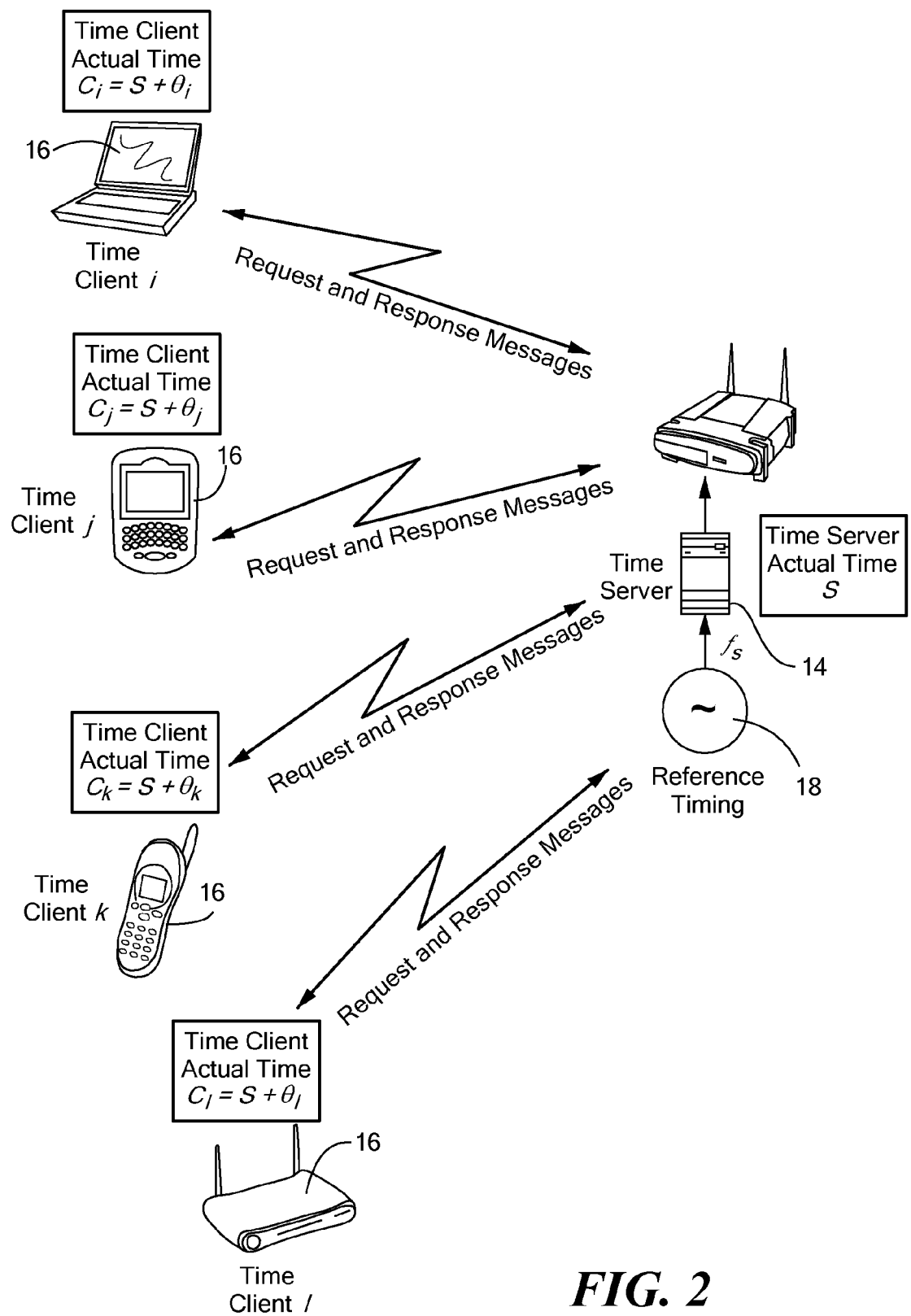
FIG. 2 is a block diagram of an exemplary wireless system architecture for time and frequency constructed in accordance with the principles of the present invention.

Referring now to the drawing figures in which like reference designators refer to like elements, there is shown in FIG. 1 a block diagram of a system architecture for a packet network constructed in accordance with the principles of the present invention and designated generally as "10". FIG. 1 and FIG. 2 show an embodiment of a time and frequency synchronization architecture used in accordance with the present invention. A packet network 12 over which request and response messages may be transmitted between a time server 14 and time clients 16 can be a wireline communication system (FIG. 1) or a wireless communication system (FIG. 2). The architecture is composed of a central timing system, which includes time server 14 and network nodes (not shown), which can include but is not limited to routers, switches, gateways, wireless access points, etc.

The architecture also includes one or more time clients 16 in communication with time server 14 via the central timing system's network nodes. Time clients 16 can be any device capable of receive communication signals including but not limited to routers, switches, gateways, wireless access points, desktop computers, laptops, personal digital assistants (PDAs), VoIP phones, data servers and the like. Communication between the central timing system and time clients 16 could be via a number of different types of networks such as but not limited to Ethernet, Internet Protocol (IP), Provider Backbone Transport (PBT), Multi Protocol Label Switching (MPLS), WiFi, Worldwide Interoperability for Microwave Access (WiMax) and the like.

FIG. 1 represents a wireline system architecture used in accordance with the principles of the present invention that achieves time and frequency synchronization in a packet network. A reference time source 18 could be based on GPS or time server 14, with a very stable and accurate clock source, such as for example, a Rubidium atomic clock. The reference time source 18 could also be taken from a Building Integrated Timing Supply (BITS) which is a single building master timing supply. BITS generally supplies DS1 and DS0 level timing throughout a Central Office (CO). The BITS concept minimizes the number of synchronization links entering a CO, since only the BITS will receive timing from outside the CO. The time server 14 actual time is represented by S. The time server clock frequency is represented by $f_s$ and the time client clock frequency is represented by $f_c$. The architecture employing the present invention transfers time to the client and at the same time makes the client's clock frequency synchronize with the server clock frequency.

FIG. 2 illustrates a wireless system architecture used in accordance with the principles of the present invention that achieves time and frequency synchronization in a packet network. In FIG. 2, S represents the time server actual time and C represents the client clock. The single local clock of the time client 16 is designated as $C=L_{clock}$. In the case where time client 16 has both a free-running hardware clock and a Phased Lock Loop (PLL) disciplined clock, these are designated, respectively, as $L_{clock}$ and C. The offset of the clock S relative to C at time $t \geq 0$ is $\theta(t)=(C(t)-S(t))$. This is referred to as the relative offset. The skew of S relative to C at time $t \geq 0$ is $\delta(t)=(C'(t)-S'(t))$. This is referred to as the relative skew. Two clocks are said to be synchronized at a particular moment if both the relative offset $\theta$ and skew $\delta$ are zero. The ensuing discussion may sometimes refer to the relative offset and the relative skew simply as offset and skew, respectively.

The following discussion describes a two-way time transfer protocol for the exchange of timestamp information between a time server 14 and a time client 16. This protocol forms a basis for the Network Time Protocol (NTP) and IEEE 1588 Precision Time Protocol (PTP). The underlying assumption of this protocol is that both forward and reverse paths of the client-server communication are symmetric in fixed communication delay.

The purpose of a two-way time transfer protocol is to have a set of client devices determine the offset between time measurements on their clocks and time measurements on a server device. For example, if the variable t represents a physical time reference, for a given client device, the offset $\theta(t)$ at time t is defined by $\theta(t)=(C(t)-S(t))$, where $C(t)$ represents the time measured on the client clock at time t, and $S(t)$ represents the time measured on the server clock at time t. Client devices periodically exchange messages with the server device to allow each client clock to recalculate the offset between its clock and the server clock. This offset will drift with time, and so these periodic exchanges mitigate the impact of this drift on clock synchronization.

An assumption for time transfer is that the exchange of protocol messages happens over a period of time so small that this offset can safely be considered constant over this period. Another assumption is that the transit time of a message going from the client to a server is equal to the transit time of a message going from the server to the client. In reality, the forward and reverse paths have different one-way delays, i.e., have asymmetric delays. The asymmetric delays are due to asymmetric bandwidths and asymmetric propagation delays on the two paths. This can happen when the physical path length, the number of network elements (switching nodes), or the port loading in each direction differs. Even when the two paths are symmetric, they may have radically different delays due to asymmetric queueing. Asymmetric delays are more prevalent in today's networks because of technologies like ADSL (having 512 Kbps uplink and 1.5 Mbps downlink) in access lines. In some scenarios, the issue of asymmetry can be solved by route pinning techniques where the forward and reverse paths pass through the same physical links and switching nodes. With route pinning, the two directions of a route are guaranteed to traverse the same links and nodes resulting in the "true" minimum delay (described below) in each direction to be equal. Finally, it is assumed that both the client and the server can measure the time they send or receive a message.

Figure 3:
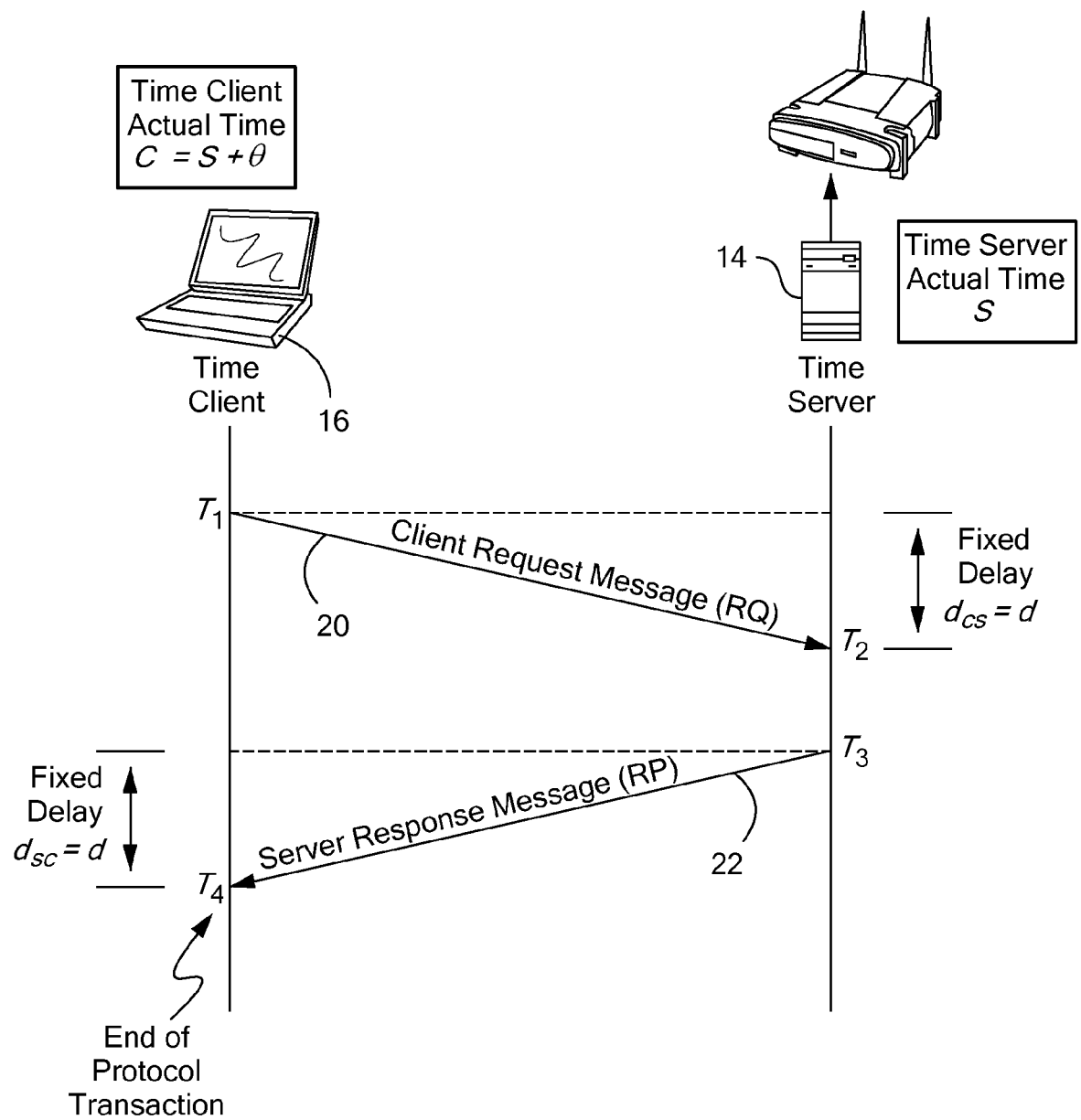
FIG. 3 is a graphical representation of a two-way time transfer protocol.

The degree to which these assumptions are enforced in a particular application determines the accuracy of the offset measured at a client device. The basic principle for computing the time offset θ and delay $d_{cs}=d_{sc}=d$, between the time client 16 and server 14, is shown in FIG. 3. In any protocol transaction, the time client 16 initially sends a request message 20 to the time server 14 that contains the timestamp $T_1$ that the message is sent. The server 14 notes the time $T_2$ it receives this message and, at a later time, sends a response message 22 back to the client 16 containing the time $T_1$ the client sent the first message, the time $T_2$ the server received that message, and the time $T_3$ that the server sends the current message 22. The client 16 notes the time it receives this message $T_4$. Under the assumption that the delays for the two paths are symmetric, the following relationships can be derived:

$$T_2 = T_1 - \theta + d$$

$$T_4 = T_3 + \theta + d$$

From these equations, the time client computes a time offset θ, and fixed delay d, as follows:

$$\theta = \frac{(T_2 - T_1) - (T_4 - T_3)}{2}$$

$$d = \frac{(T_2 - T_1) + (T_4 - T_3)}{2}$$

The degree to which these assumptions are enforced in a particular application determines the accuracy. In practice, the delay across the network is not constant, with the i-th packet experiencing a different delay, d(i), where d(i) can be expressed as $d(i)=d+\epsilon(i)$. The variable $\epsilon(i)$ represents the sum of the random components contributed by each hop in a particular packet transmission. The input to the client clock synchronization algorithm thus includes an error component corresponding to $\epsilon(i)$ and must be appropriately filtered to minimize the deleterious impact of PDV on clock synchronization.

In a clock synchronization network, the time server 14 source is a reliable, stable, and accurate reference such as a GPS or BITS. However, the synchronization performance at time clients 16 depends on several other factors. One of these factors is the time transfer protocol and settings. The type of time transfer protocol and its settings (protocol messages per second, one-way or two-way message transfer, unicast or broadcast/multicast message distribution, redundancy of time servers, quality level of time server source, etc.) affect synchronization performance. One-way transfer is an asymmetric operation that only requires timing protocol message flow originating in one direction. For example, consider a timing flow originating at the server clock and terminating at the client clock. Of the four timestamps $\{T_1, T_2, T_3, T_4\}$ in FIG. 3, only two are needed in this mode $\{T_3, T_4\}$. Two-way timestamp operation requires timing message flow in both directions. Thus, all four timestamps $\{T_1, T_2, T_3, T_4\}$ in FIG. 3 are employed in time synchronization.

In a two-way time protocol transaction, the timestamp flow is initiated by one element, typically the client in NTP and server in IEEE 1588. One-way messaging protocols offer only frequency distribution while two-way messaging protocols offer both frequency and time distribution. One-way messaging protocols deliver frequency information from the server 14 where the frequency is known. Time distribution protocols are generally two-way (i.e., bidirectional) due to the requirement of network traversal delay measurement (ranging), and they usually assume symmetric (or known asymmetry) propagation times.

Synchronization performance is also affected by network design and its characteristics, such as traffic loading, PDV, packet losses, reordering of packets, software or hardware timestamping, etc. Timing equipment with hardware timestamping has measurement accuracies in the tens of nanoseconds. This makes the timing hardware a smaller contributor to the overall measurement errors in the system. PDV significantly degrades clock synchronization because it introduces variable delays to the travel time of time transfer protocol messages. Regardless of whether the network is lightly or heavily loaded, messages are short or long, or whether the network equipment use priority queueing or not, the potential for protocol messages to experience delay variations still exists. Timestamp filtering and minimum (min) delay selection in addition to the use of robust algorithms can mitigate this problem.

Another factor that influences synchronization performance at time clients 16 is the client clock oscillator. Employing a high-stability oscillator reduces measurement noise and improves the ability of the client clock synchronization mechanism to filter out transmission wander and jitter caused by network impairments like PDV. Several factors need to be considered when selecting the client oscillator. First, the quality of the oscillator determines to a large extent the rate at which clock corrections must be made. The quality of the oscillator also determines to a large extent the time constant that can be implemented in any clock recovery loop. The action of the clock recovery loop can be modeled in terms of a low-pass filter. That is, the timing information implicit in the packets (timestamps, times-of-arrival, times-of-departure, etc.) is processed in such a way that the "dc content" of the resulting signal contains the true timing information and the rest must be filtered out.

When the output of a clock is examined, the high-frequency content of the clock noise can be attributed to the local oscillator and the low-frequency content of the clock noise can be attributed to the reference subject to the low-pass filtering action of the clock recovery loop. The timing reference input at the client 16 in the case of packet-based synchronization methods is "noisy" and the noise is related to the PDV introduced by the network superimposed upon the clock noise of the server 14.

Still another factor that influences synchronization performance at time clients 16 is the clock recovery loop and PLL control. Advantageously, the present invention employs a phase-locked loop (PLL) at a time client 16 to measure the phase difference between its clock and that of the server to generate an error signal. This error signal is then filtered by the loop filter to produce a control signal which in turn is used to drive the client oscillator. The goal is to reduce this error to zero or a small acceptable error range. The PLL also acts to correct for server oscillator drift (due to temperature and aging effects, etc.), and other environmental conditions that affect oscillator stability. PDV gets passed to the PLL input, and so the larger the PDV and the more random its noise profile, the more sophisticated the PLL and its loop filter has to be to accurate synchronized to the timing reference.

As discussed below, the observed arrival times of timing protocol messages at the client 16 are influenced by the frequency offset (clock phase drift) of the client 16 with respect to the server 14, and the network PDV. The former factor is tracked (i.e., frequency synchronization required), while the later is filtered out by the client clock synchronization mechanism. The clock synchronization mechanism also has to be optimized to minimize the amount of network bandwidth consumed by timing protocol messages. Furthermore, it is desirable that the synchronization mechanism be designed to be robust to packet loss, packet reordering, packet delay, PDV, and infrequent step changes in the network traversal delays which might be due to rerouting, protection switching, or network traffic load changes.

There are a number of tradeoffs on client clock oscillator stability, time transfer protocol design and setting, and network design. The more frequent the time client synchronizes, the less stable the oscillator needs to be. This requires a network that is less prone to congestion and transmission errors. If timing messages experience excessive delays, delay variations, or losses, a reduced synchronization rate (due to a lower rate of transmission of timing messages), causes the time client 16 to accumulate timing errors which would degrade the quality of the client clock. Under progressively heavier load, the timing messages get delayed more, thus allowing more time for errors to accumulate in the time client 16. When this happens, it is the oscillator type and characteristics that become the determining factors in the amount of synchronization time error that accumulates in the client clock.

In situations where a high-stability oscillator is not used at time client 16, or in the absence of an external or physical layer frequency distribution mechanism like Synchronous Ethernet, then a higher layer time distribution protocol (e.g., NTP, IEEE 1588, etc.) is used. Note that the time distribution protocols also perform frequency distribution. Usually the protocol used to distribute time across the packet network is the same protocol used to distribute frequency.

The following discussion focuses on the use of higher layer time distribution protocols for time and frequency transfer-over-packet networks. Time distribution messages (i.e., packets) are sent from a time server 14 with timestamps measured by the server clock 18. In the absence of queueing, contention, and other network impairments, these packets are sent and received by a time client 16 after a network propagation delay, that is, the minimum (min) delay. Without queueing and additional delays, all packets are received after this minimum delay, otherwise, they are received with variable delay. The time client 16 measures the arrival times of packets using its local clock but this clock can have frequency offset with respect to the time server clock. The observed arrival times differ from the timestamps generated by the server 14 due to the frequency offset (the difference in frequency between the client and server clocks) and the travel delay between server and client, which, in turn is made up of the minimum (electrical propagation) delay, and the extra delays due to queueing, contention, etc.

Therefore, the present invention provides a client clock synchronization method in order to lock the client clock frequency $f_c$ to the server frequency $f_s$ and to measure the minimum (intrinsic) delay, a process referred to as ranging. The accuracy of the time at the client 16 depends on how accurate the ranging mechanism determines the time of flight of the timing protocol messages from the server 14 to the client 16.

With a stable oscillator at the client end, or the use of a frequency distribution mechanism such as Synchronous Ethernet, ranging is still required but the task of locking the client clock frequency $f_c$ to the server frequency $f_s$ is not necessary. However, in the absence of a stable frequency source at the client 16, the client time transfer protocol and clock synchronization mechanisms first have to stabilize the client clock frequency, and afterwards lock the time. The convergence time is the time to converge to the desired time accuracy and is the sum of the time to obtain frequency lock, and the time for the ranging procedure to converge.

As noted earlier, the use of Synchronous Ethernet or similar technology eliminates the first term (the time to obtain frequency lock), thereby significantly reducing the convergence time for time synchronization. However, if a higher layer time transfer solution is adopted that simultaneously adapts frequency and time, then its convergence time is longer. Once convergence is attained, the time distribution system works continuously to minimize the steady-state error. To achieve this, the system continues updating the client clock frequency, and continues the ranging process to update local time. The steady-state time error then becomes the sum of the frequency error (wander) contribution, and the ranging error (caused by PDV, asymmetry, loss of protocol messages, etc.).

We now consider only the one-way transfer between the server and the client, shown in FIG. 3. The timestamp contained in a packet is indicative of the time at the server 14 when the packet was generated, but in some cases the timestamp reflects the time of departure of the packet. The instant of departure/generation of the i-th packet is designated as $T_S(i)$. The associated timestamp is denoted by $T_3(i)$. If the source clock is ideal and timestamping perfectly implemented, then $T_S(i)=T_3(i)=T(i)$, where $T(i)$ is the true time epoch of the i-th packet. This packet traverses the network and arrives at the client at instant denoted as $T_C(i)$. The associated timestamp is denoted as $T_4(i)$.

When considering non-ideal timestamping, the current timestamp of each one of the $\{T_3, T_4\}$ timestamps is a combination of the true time epoch $T(i)$ and two error terms and can be represented as $$T_{timestamp}=T(i)+e_{clock}+e_{timestamp},$$

where $e_{clock}$ is a direct contribution of the local clock error, and $e_{timestamp}$ is the inaccuracy in the timestamp process (which can obscure the behavior of the clock). The measured delay $d_{m\_server\_client}(i)$ for message i can be expressed as follows:

$$d_{m\_server\_client}(i)=T_4(i)-T_3(i),$$

where $$T_4(i)=T(i)+d_{server\_client}(i)+e_{client\_clock}+e_{client\_timestamp},$$

$$T_3(i)=T(i)+e_{server\_clock}+e_{server\_timestamp},$$

where $d_{server\_client}(i)$ is the server-to-client delay experienced by the i-th packet. Thus, the $d_{m\_server\_client}(i)$ can now be expressed as $$d_{\text{m\_server\_client}}(i) = d_{\text{server\_client}}(i) + (e_{\text{client\_clock}} - e_{\text{server\_clock}}) + \quad (1)$$
$$(e_{\text{client\_timestamp}} - e_{\text{server\_timestamp}}) = d_{fsc} + \varepsilon_{sc}(i) +$$
$$(e_{\text{client\_clock}} - e_{\text{server\_clock}}) + (e_{\text{client\_timestamp}} - e_{\text{server\_timestamp}})$$

where $d_{fsc}$ is the fixed server-to-client delay, and $\epsilon_{sc}(i)$ represents the sum of the random components contributed by each hop in the server-client direction in the i-th packet transmission.

The above expressions reveal several properties. First, the measured delay $d_{m\_server\_client}(i)$ is biased by the one-way packet delay $d_{server\_client}(i)$. The packet delay cannot be estimated with one-way delay measurements if the client clock offset with respect to the server 14 is not known. One-way time transfer methods cannot establish a client clock offset. As discussed below, the two-way transfer allows for the determination of clock offset information. In addition, the packet delay bias (contributed by $\epsilon_{sc}(i)$) can be minimized by selecting one-way transactions with min delay properties, that is, using timestamp filtering and minimum delay selection, which is to be discussed below. Further, the timestamp error at the server 14 and client 16 should be properly constrained for acceptable operation. This could be done by using hardware timestamping as described above.

The above discussion can be extended to the two-way timestamp transaction. The measured delay in both directions can then be represented, respectively, by:

$$d_{m\_client\_server}(i) = d_{client\_server}(i) + (e_{server\_clock} - e_{client\_clock}) + (e_{server\_timestamp} - e_{client\_timestamp})$$

$$d_{m\_server\_client}(i) = d_{server\_client}(i) + (e_{client\_clock} - e_{server\_clock}) + (e_{client\_timestamp} - e_{server\_timestamp})$$

where $d_{client\_server}(i)$ is the client-to-server delay experienced by the i-th packet. To simplify the discussion, it is assumed that hardware timestamping is used, as a result the timestamp errors are negligible. Thus, the offset and round-trip delay (RTD) can be computed as:

$$\theta(i) = \frac{d_{m\_client\_server}(i) - d_{m\_server\_client}(i)}{2}$$

$$= \frac{\lfloor d_{client\_server}(i) - d_{server\_client}(i) \rfloor}{2} + (e_{server\_clock} - e_{client\_clock})$$

$$RTD(i) = d_{m\_client\_server}(i) + d_{m\_server\_client}(i) = d_{client\_server}(i) + d_{server\_client}(i) =$$

$$d_{fcs} + d_{fsc} + \varepsilon_{cs}(i) + \varepsilon_{sc}(i)$$

where $d_{fcs}$ is the fixed client-to-server delay, and $\epsilon_{cs}(i)$ represents the sum of the random components contributed by each hop in the client-server direction in the i-th packet transmission. The offset represents an estimate of the clock correction required to align the client time to the server time and the RTD represents an estimate of the total round-trip path delay.

From the above expressions, it can be observed that to obtain an unbiased offset estimate, the server-client and client-server path delays must either be known or assumed symmetric and, an unbiased estimate of the RTD depends on the clock errors being the same for both directions. If the time between the two packet exchanges is low then the clock errors can be assumed common to both transactions.

Ranging protocols typically function by exchanging request (RQ) and response (RP) messages, computing round-trip time using four timestamps, estimating one-way time assuming server-client path symmetry, and if possible, minimizing PDV effects on time synchronization by timestamp filtering and min delay selection, also referred to as minimum gating.

The motivation for timestamp filtering and minimum delay selection is that there are some (timing protocol) packets that traverse the packet network with essentially no queueing delay and that, these packets can be identified by filtering out packet with minimum round-trip delay. The approach adopted in NTP is to filter out transactions with minimal traversal time in both directions (both client-server and server-client directions).

NTP maintains a window of the last L transactions (typically 8 for a network connection). For each transaction, both the offset estimate and the associated round-trip delay are determined. The overall queueing noise experienced by a packet flow is directly reflected in the round-trip delay although the magnitude of the noise in each direction is not known. Selecting low round-trip delay mitigates the impact of the long-tail delay distributions experienced in packet networks permitting significant performance improvements over clock synchronization algorithms with no packet selection criteria. However, selecting transactions with minimum round-trip delays is not always sufficient.

To further highlight the above point, it is assumed that the probability of minimal delay one-way traversal is $p_{min}$. Thus, the probability of round-trip minimal delay traversal is $p_{min}^2$, which is very small. Therefore, in this example, there will not be an appreciable portion of transactions with minimal delay. Thus, identifying a single transaction with minimal traversal time in both directions is not effective for time synchronization.

However, an effective method of selecting two-way transactions with minimum delay is monitoring the four timestamps generated by the client and server and noting those with the minimal difference independently in each direction. The probability of these two events is $p_{min}$ and not $p_{min}^2$.

In the scenario described above, it is expected that a higher portion of the traversal events in each direction can be identified. This improves the ranging performance and, thus, time synchronization, since the time client ensures that only two separate minimal traversal events are used in the regular time synchronization calculations.

From the above discussion it can be see that the PDV has a probability distribution function with a "floor". The floor is the minimum delay that a packet (or a timing protocol message) can experience in a given path. This "floor" can be considered to be the condition where all queues along the path between server and client are near their minimum when the particular packet is transmitted. Under normal non-congested loading conditions on the path, a fraction of the total number of packets will traverse the network at or near this floor, even though some may experience significantly longer delays. Under these non-congestion conditions, store-and-forward operations in high-speed devices effectively become forwarding efforts with packets forwarded with minimum delay. In addition, the PDV distribution becomes more concentrated near this floor, with a relatively large fraction of the total packets experiencing this "minimum" or "near minimum" delay.

In reality, the floor of the PDV distribution can be limited by the physical layer propagation delay (limited by speed of light), timestamp resolution (hardware timestamping helps here), delays introduced by data mapping in TDM based transport systems (e.g., packet over SONET/SDH, xDSL, GFP, etc.), small delay variations such as PHY clock jitter, backplane clock domain jitter, etc., or the local clock offset tilt during packet traversal delay "floor" assessment.

Thus, there is a notion of a minimum delay for a given network configuration and all packets between the server 14 and client 16 will experience no less than this minimum delay. In particular, under low loading conditions there will be a significant percentage of packets that experience the minimum delay. If there are a sufficient number of packets that experience the minimum delay, then by utilizing just these packets, the client clock can achieve significantly better time alignment with the server.

Figure 4:
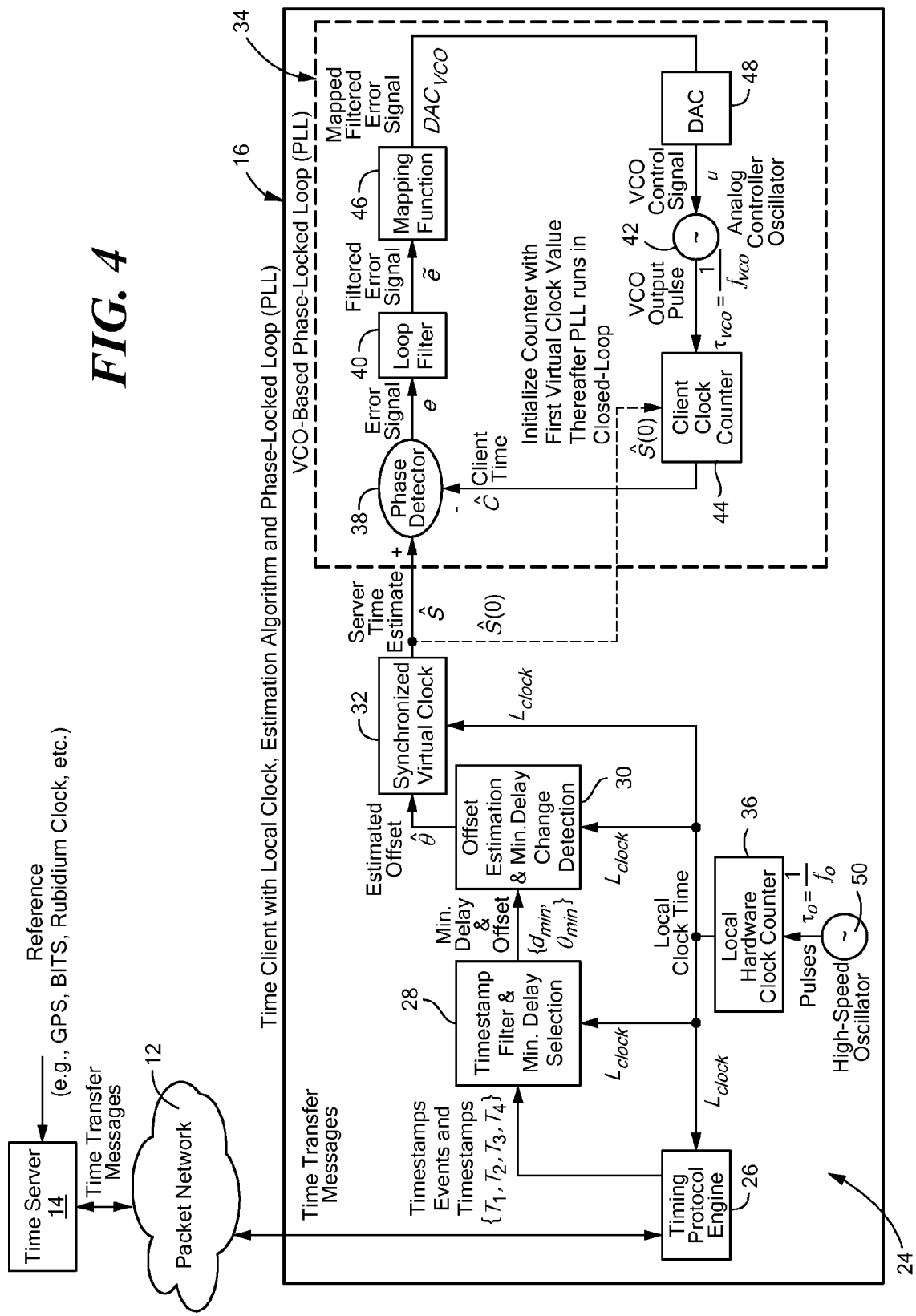
FIG. 4 is a block diagram of the time server/time client synchronization system constructed in accordance with the principles of the present invention.
Figure 5:
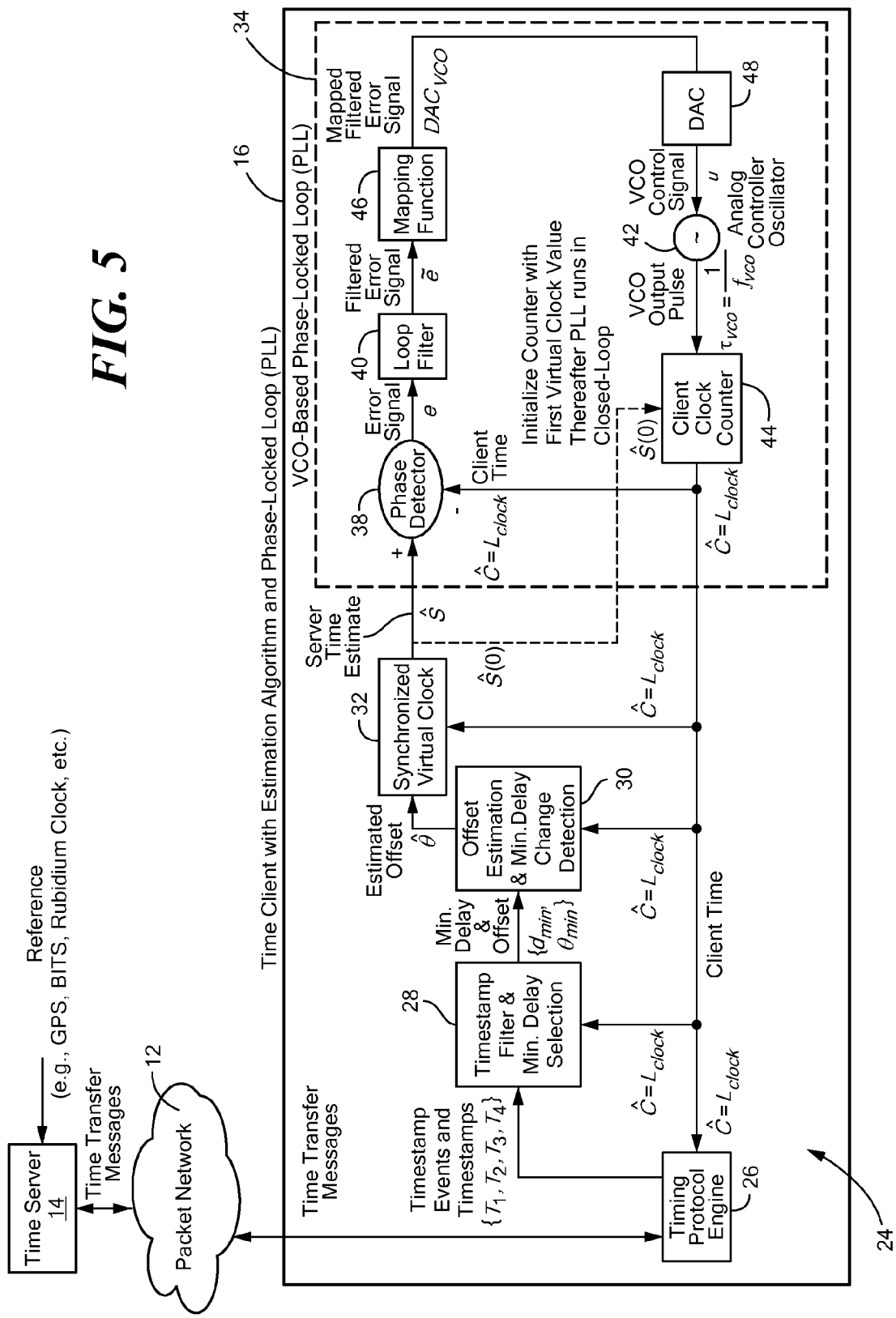
FIG. 5 is a block diagram illustrating an alternate embodiment of the time server/time client synchronization system constructed in accordance with the principles of the present invention.

FIG. 4 and FIG. 5 illustrate high-level block diagrams of exemplary client clock synchronization architectures in accordance with the principles of the present invention. Each of these architectures includes a time client 16 that can be divided into two components. One component is a minimum delay and clock offset estimation portion 24 that includes a timing protocol engine 26, a timestamp filter and minimum delay selection module 28, a clock offset estimation and sudden minimum delay change detection module 30, and synchronized virtual clock 32. The other component of time client 16 is a PLL 34 for both frequency and time recovery.

The PLL 34 is the component in the architectures depicted in FIGS. 4 and 5 that allows for joint time and frequency recovery at the time client 14. When two clocks are not synchronized and, more specifically, have different frequencies, time durations measured with one clock will be different from the other. The idea is to tune the oscillator of the PLL 34 such that the time duration measured by the time client 16 will be consistent with that of the time server 14, that is, they both have zero offset and skew. In doing so, the PLL 34 achieves both time and frequency alignment at the time client 16.

The reference input to the PLL 34 is the estimated time of the server $\hat{S}$. The PLL 34 uses this estimated time to lock onto the server clock 18. The following discussion describes the main functional blocks of the synchronization architectures of the present invention.

The timing protocol engine module 26 is responsible for exchanging request (RQ) messages 20 and response (RP) messages 22 with the time server 14 to obtain the four timestamps $\{T_1, T_2, T_3, T_4\}$. Protocols such as NTP, IEEE 1588 or variants may be used. The protocols executed here may assume client-server path symmetry. The module may integrate hardware time stamping of received and transmitted packets in order to improve timestamp accuracy. The time transfer protocol may include cryptographic authentication to prevent accidental or malicious protocol attacks. Some of the protocol attacks include misleading timing messages purposely distributed by false time servers, and man-in-the-middle attacks tampering with valid timing messages. These attacks could mislead clients 16 and interrupt reliable time distribution to critical applications.

The timestamp filter and minimum delay selection module 28 may operate either in a "synchronous" or "asynchronous" mode. In the "synchronous" mode, a timer is set and, out of all the traversal events in the timer valid period, the module identifies one separate minimal traversal event for each direction when timer expires. In the "asynchronous" mode, out of L traversal events in each direction, the module identifies one separate minimal traversal event for each direction. The operation of module 28 is such that, when there is a significant fraction of the timing messages that experience essentially no delay, it chooses the one with minimum delay and discards the others.

For example, let the arguments of the messages with minimum delay identified (among all messages in the sampling period) in the forward direction ($RQ_i$, i=1,2, ..., L) and reverse direction ($RP_j$, j=1,2, ..., L) be represented, respectively, as $$im = \arg\{\min_i(T_{2,i} - T_{1,i})\}, i = 1, 2, \ldots, L$$

$$jm = \arg\{\min_j(T_{4,j} - T_{3,j})\}, j = 1, 2, \ldots, L$$

Then the associated delay and offset are computed as follows:

$$d_{min} = \frac{(T_{2,im} - T_{1,im}) + (T_{4,jm} - T_{3,jm})}{2}$$

$$\theta_{min} = \frac{(T_{2,im} - T_{1,im}) - (T_{4,jm} - T_{3,jm})}{2}$$

The time between $d_{min}$ and $\theta_{min}$ computation is defined as the sampling period (or estimation interval), $T_{sp}$ of the system. The choice of the sampling period $T_{sp}$ is done in such a way that timestamp filtering and minimum delay selection will be effective, and the same time, the rate of protocol messages after timestamp filtering to the client 16 is sufficient. As discussed above, the quality and type of the oscillator determines to a large extent the rate at which clock corrections must be made, or equivalently, the rate of flow of protocol messages to the client.

Having obtained the $d_{min}$ and $\theta_{min}$ values, the $d_{min}$ value is passed to the clock offset estimation and sudden minimum delay change detection module 30 where a true sudden minimum delay change detection algorithm determines if there has been a true change in the minimum delay which might be as a result of, rerouting, protection switching of a route, etc. In general, rerouting or protection switching of a route at the physical and/or packet layers would change the transfer delay of the route. The sudden minimum delay change mechanism is used to distinguish random delay spikes from true (intrinsic) minimum delay changes. Alternatively, since network symmetry is assumed here, either the forward min delay $d_{cs\ min} = \min(T_{2,im} - T_{1,im})$ or reverse min delay $d_{sc\ min} = \min(T_{4,jm} - T_{3,jm})$ can be used in the change detection method.

Depending upon the outcome of the sudden minimum delay change computation, the $\theta_{min}$ value is low-pass filtered to obtain $\hat{\theta}$, which is then used for client time synchronization. The filter value $\hat{\theta}$ may be obtained using a simple Finite Impulse Response (FIR) filter to more sophisticated filters such as, for example, a Kalman filter. In one approach, the offset estimate is equal to the instantaneous values $\theta_{min}$ obtained after a sampling period, and the PLL 34 is adjusted to follow the instantaneous value at the end of each transaction. However, since this adjustment offset signal could result in an instantaneous phase step, which could result in the recovered clock at the client to exceed some or all of the application jitter/wander requirements, a filtered offset is preferable. A short-length FIR filter is capable of eliminating phase steps in the recovered clock. The objective is to produce acceptable jitter and wander accumulation with suitable PLL bandwidth, gain peaking and noise generation.

One use of the $d_{min}$ and $\theta_{min}$ values in a change detection mechanism, is described as follows:

IF a true min delay change is detected THEN
    set $\hat{\theta}$ value to min delay value $\theta_{min}$ at time of change, discarding all history
ELSE
    continue filtering the $\theta_{min}$ values to obtain $\hat{\theta}$ A fundamental assumption is that packet paths can be viewed as static over some interval of time, with fundamental changes occurring infrequently. If the interval of the path update is much larger than the packet exchange interval, the path can be treated as constant for a given set of measurements.

The synchronized virtual clock 32 module converts the clock offset generated by the local clock 36 into clock estimates for client applications. The synchronized virtual clock 32 executes a conversion function applied to the local clock $L_{clock}$ to generate the server time estimate $\hat{S}$ which is the reference time input to PLL 34 as seen in FIG. 4 and FIG. 5. One such conversion function is $$\hat{S}(t) = L_{clock}(t) - \hat{\theta}(t)$$

for clock offset $\hat{\theta}(t)$ estimate obtained at time t.

The estimate $\hat{\theta}$ (or equivalently, $\hat{C}$) needs to be reformatted before being used by applications on the time client 16. Formatting involves translation between different representations (e.g., converting from seconds after a given reference date to date and time), changing time zones, etc. Further processing is often needed when the time needs to be displayed on a computer, mobile device, etc. This processing may include identification of day of week, translation to other calendars (e.g., Gregorian, Julian, Hebrew, Islamic, Persian, Hindu, Chinese), conversion between International Atomic Time (TAI) and Coordinated Universal Time (UTC), and flagging of holidays and special dates.

Time client phase-locked loop (PLL) 34 has as its components a phase detector 38, a loop filter 40, a controlled oscillator 42, and a clock counter 44. The phase detector 38 computes the error signal as the difference between the estimated server current time (reference signal $\hat{S}$) and the output signal of PLL 34 which is the estimated client current time (PLL output $\hat{C}$). The error signal is passed on to loop filter 40 which is responsible for eliminating possible jitter and noise in the input signal. The filtered error is then mapped/transformed by mapping function module 46 in conjunction with a digital-to-analog converter (DAC) 48 into a corresponding control signal that drives controlled oscillator 42. Details of the mapping function module 46 are provided below.

The control signal could be voltage for a voltage controlled oscillator (VCO), or current for a current controlled oscillator (CCO). The controlled oscillator 42, which typically has a center frequency, oscillates at a frequency which is determined by the output signal of loop filter 40.

The PLL 34 serves as a feedback loop that adjusts the frequency and phase of the controlled oscillator 42 to the discrete input signal $\hat{S}$. Thus, the output $\hat{C}$ of the controlled oscillator 42 is a continuous-time approximation of the synchronized time $\hat{S}$. In FIG. 4 and FIG. 5, VCO refers broadly to all the categories of voltage controlled oscillators such as but not limited to a Crystal Oscillator (XO) or Simple Packaged Crystal Oscillator (SPXO), Voltage Controlled Crystal Oscillator (VCXO), Temperature Compensated Crystal Oscillator (TCXO), and Oven Controlled Crystal Oscillator (OCXO). The oscillator selection has an impact on the performance of PLL 34 and its ability to meet the required jitter and wander specification of the intended application. Factors to consider are frequency accuracy, frequency aging, frequency-temperature characteristics, short-term frequency stability, power consumption, size, and price.

An assumption behind the synchronization architectures is that for a given clock, the oscillator 42 has a frequency that can change, but only slowly with time. Real oscillators especially those used in telecom and high-end applications have well-behaved short-term frequency stabilities so it is realistic to assume here that the oscillators used in the architectures have frequencies that are constant or slow-varying with time. Another assumption is that the offset $\theta$, skew $\delta$ and drift $\mu$ of the system are slowly varying functions of time. It is realistic to assume that these parameters are constant between estimation and control instants of the PLL 34.

The clock synchronization architecture depicted in FIG. 4 has both a local free-running clock 36 and a PLL 34. The local free-running clock 36 is not modified in any way; events happening on the time client 16 are recorded with the time read from this unmodified local clock 36. The output of local clock 36 is designated as $L_{clock}$ and that of PLL 34 is $\hat{C}$. PLL 34 is considered to be a variable-frequency controlled oscillator, slaved to a global server clock 18. The actual implementation of PLL 34 may use a hardware clock servo or may be algorithmic.

If the estimate of $\hat{S}$ is accurate (based on application requirements) and PLL 34 is properly designed, then the output frequency $f_{OCS}$ of the VCO 42 will track the reference frequency $f_s$ of the time server 14. Thus, the clock architecture generates time ($\hat{S}$) and frequency ($f_{OCS}$) references that track the references at server 14. Because the frequency $f_{OSC}$ of the controlled oscillator 42 is tuned to match $\hat{C}$ to $\hat{S}$, the characteristics of $\hat{C}$ exhibit a smooth continuous profile instead of being piecewise linear. Also, by enhancing any of the architecture with frequency synthesis functionalities, multiples and sub-multiples of the nominal frequency of the PLL 34 (e.g., pulse per second (PPS) signal) can be generated for applications at the time client 16. This is normally the case when the PLL frequency output is not in the format required for client applications.

In the clock architecture described in FIG. 4, the client node implements a local timescale, i.e., a device clock 36, and references this timescale in the time transfer messages it transmits. The device clock 36 is independent, and is typically driven from a local free-running crystal oscillator 50. The device clock 36 is not adjusted or servoed to follow a server reference. However, in FIG. 5, there is no free-running clock but instead a PLL 34 whose output serves as the local clock. Timing protocol messages reference this PLL driven clock.

In the architecture depicted in FIG. 5, PLL 34 output $\hat{C}$ (which also serves as the local clock, $\hat{C}=L_{clock}$) is used to determine the amount by which the time client 16 should adjust its local clock, (that is, the PLL 34 output). The oscillator control signal (and its corresponding output frequency $f_{OSC}$) is held constant for a sufficient length of time (the sampling period $T_{sp}$) to allow all protocol transactions between time server 14 and client 16 to complete and to obtain observation data.

A new control input and corresponding output frequency $f_{OSC}$ of the system is then considered valid until the next synchronization instant. Between control instants, the PLL output frequency is held constant. The time elapsed between two events, when enclosing one or more adjustments, cannot be determined accurately because the PLL 34 cannot keep track of all the adjustments and their cumulative effect on the local clock $\hat{C}=L_{clock}$. In addition, the action of adjusting the PLL 34 introduces by itself nondeterministic error because the action of adjusting the input requires time to produce a steady output.

Referring still to FIGS. 4 and 5, initially, the PLL 34 waits for the first available server current time estimate $\hat{S}(0)$ and loads it into the clock counter 44. From this point onwards, PLL 34 starts to operate in a closed-loop fashion. Each time the server current time $\hat{S}(n)$ is estimated (i.e., at discrete sampling instants n=1,2,3, . . . ), the error difference e(n) between this $\hat{S}(n)$ value and the current time indicated by the client clock counter $\hat{C}(n)$ is computed, $e(n)=\hat{S}(n)-\hat{C}(n)$. This error term is sent to the loop filter 40 whose output controls the frequency of the VCO 42. The output of the VCO 42 in turn provides the clock frequency of the time client 16 and also drives a client clock counter 44. The error term is expected to converge to zero in steady state which means the PLL 34 has been locked to the incoming time base, i.e., time base of the time server 14.

This client synchronization architecture of the present invention allows the PLL 34 to resume closed-loop operation even after interruption of the protocol message exchange while the time client is still powered up. Interruption of the message exchange could be due to loss of protocol transaction packets, break in communication link, or time server temporary unavailable. If, for whatever reason, time transfer packets are not received, then the PLL 34 goes into holdover mode. The holdover mode is an operating condition of a clock in which its local controlled oscillator is not locked to an external synchronization reference but which is using storage techniques to maintain its accuracy with respect to the last known frequency comparison with a synchronization reference. The stored data is averaged to minimize the effects of short-term variations, allowing the normal conditions to be simulated within specifications. Holdover terminates when the output of the clock is no longer controlled by the data stored from a previously connected reference. The quality of the holdover output depends on quality and type of oscillator used. The holdover mode is different from the free-running mode which is an operating condition of the clock in which its local oscillator is not locked to an external synchronization reference, and is using no storage techniques to sustain its accuracy. If the time client is powered up again after being powered down, the PLL 34 just loads the most recent time estimate $\hat{S}(n)$ into the clock counter 44 and resumes closed-loop operations again.

The timestamp filter and min delay selection module 28 records the minimum delay in each direction on the route between time server 14 and client 16. The "true" minimum delay is equal to the non-congested intrinsic delay of the server-client route which in turn depends on the physical path length and the number of nodes. The nosier or lightly loaded the route is, the easier and faster the module will find the true minimum delay. A desirable feature in this operation is to identify true (intrinsic) minimum delay changes and avoid false minimum delays (spikes, outliers, or falsetickers) which can produce incorrect clock corrections.

True minimum delay changes occur, for example, when a rerouting or protection switching of a route occurs. For example, any of these conditions can lead to an increase in the transfer delay, particular, the true minimum delay. Failure to detect such true changes can give rise to clock offset errors where the current minimum delay used in clock corrections is far below that truly existing in the network path. The change detection technique framework described herein helps to identify when true minimum delay changes occur in the networks and allows appropriate actions to be taken for clock correction.

Change detection is one way of determining when a discrete change occurs in a given sequence of data points. Change detection is also a factor in most tracking applications, since it is rarely true that the system model is truly time-invariant. Some examples include detecting motion model changes in target tracking, positioning, navigation, or robot localization problems, using one or a network of visual, acoustic, or radar sensors; or detecting abnormal shape changes in computer vision/biomedical image analysis applications, e.g., detecting abnormal human activities/actions, abnormal shape changes in heartbeat patterns (usually the first indicators of cardiovascular disease), or detecting abnormal brain shape deformations during image-guided surgery. In all of the above applications, the state (signal of interest) is not directly observed. The observation is a noise-corrupted and nonlinear function of the state. Very often, the changed system model is not known, i.e., the change or abnormality is not characterized. Also, the change may be a gradual one, e.g., a constant velocity target slowly accelerating to a higher speed or a sudden one.

Online detection of a change can be formulated as follows. Let $Y_1^k$ be a sequence of observed random variables with conditional densities $p_\phi(y_k|y_{k-1}, \ldots, y_1)$. Before the unknown change time $t_0$, the parameter of the conditional density $\phi$ is constant and equal to $\phi_0$. After the change, this parameter is equal to $\phi_1$. In online change detection, one is interested in detecting the occurrence of such a change.

Figure 6:
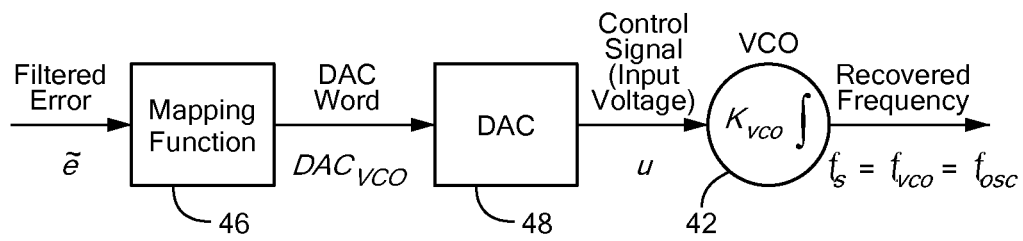
FIG. 6 is a block diagram of the voltage controlled oscillator of FIG. 4 and FIG. 5.

FIG. 6 is a block diagram of the voltage controlled oscillator (VCO) 42 used to control the client hardware clock counter 44 in the PLL 34 of time client 16. VCO 42 is an oscillator that changes its frequency according to a control voltage feed to its control input. In applications where the control signal for frequency control is digital, a Digital-to-Analog Converter (DAC) 48 has to be implemented at the input to VCO 42. DAC 48 is a device for converting digital signals into continuous analog signals. The converter usually buffers the input so that the output remains the same until the input changes.

Figure 7:
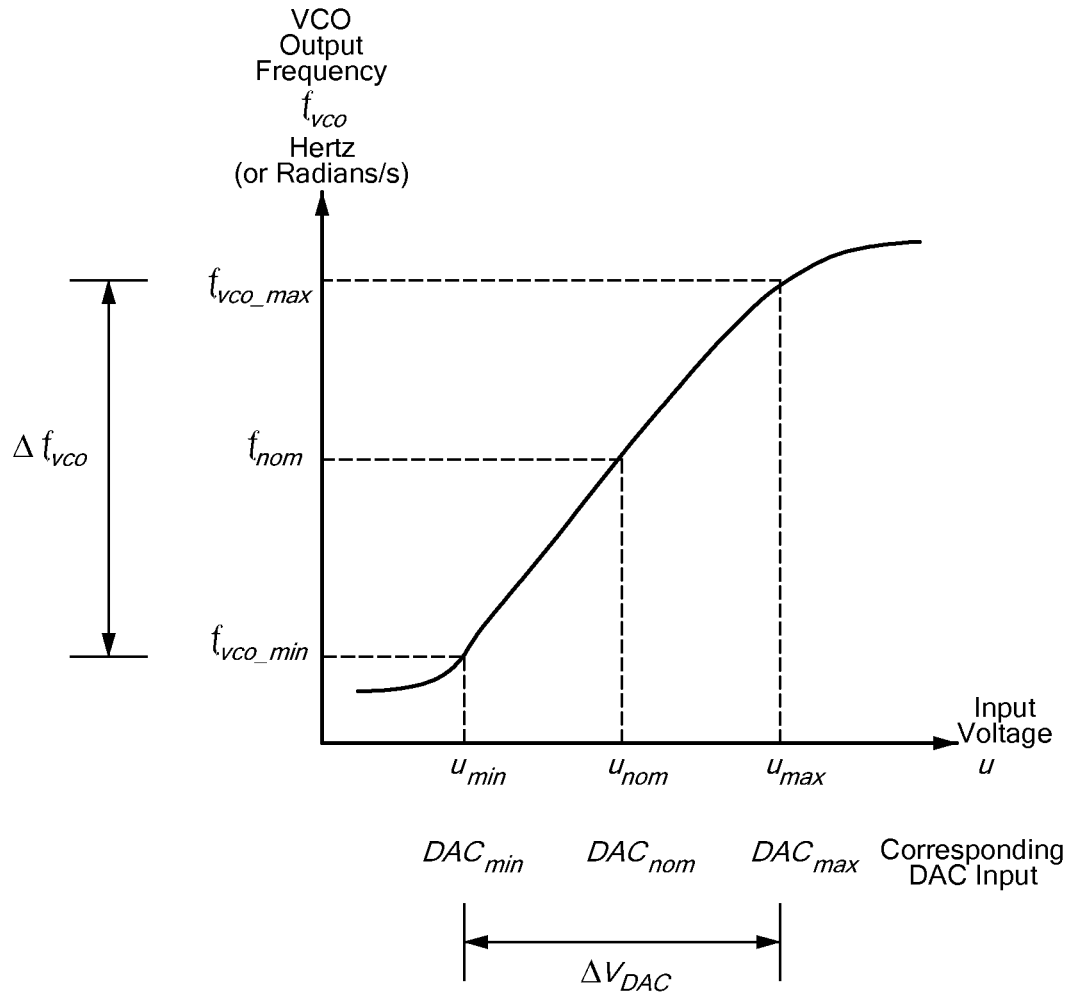
FIG. 7 is a graphical representation of the performance characteristics of the controlled oscillator of FIG. 4 and FIG. 5.

FIG. 7 illustrates the useful operating range of the VCO frequency-voltage characteristic curve, which is typically linear. The VCO 42 oscillates at an angular frequency $\omega_{VCO}(t) = 2\pi f_{VCO}(t)$ which is determined by the DAC output voltage $u(t)$. The angular frequency of the VCO $\omega_{VCO}(t)$ is given by $$\omega_{VCO}(t) = \omega_{nom} + K_{VCU} u(t),$$

where $\omega_{nom} = 2\pi f_{nom}$ is the nominal or center angular frequency of the VCO (expressed in rad/sec), $f_{nom}$ is the nominal frequency in Hertz, $K_{VCO}$ is the VCO gain (in rad/sec-V). The deviation of the VCO from its center frequency is $\Delta\omega(t) = \omega_{VCO}(t) - \omega_{nom} = K_{VCO} u(t)$. By definition, the VCO phase $\theta_{VCO}$ is given by the integral over the frequency variation $\Delta\omega$, that is, $$\theta_{VCO}(t) = \int_0^t \Delta\omega(x) dx = K_{VCO} \int_0^t u(x) dx.$$

Figure 8:
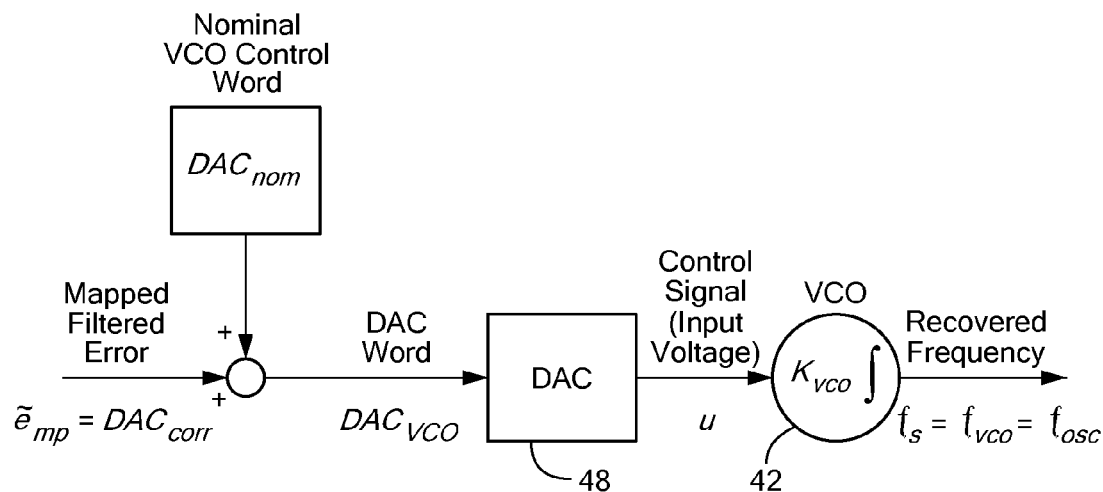
FIG. 8 is a block diagram illustrating a digital-to-analog converter controlling the frequency of the voltage controlled oscillator of FIG. 4 and FIG. 5.

In one example, $DAC_{res} = 2^L$ represents the DAC input resolution, where L is the DAC register length in bits, e.g., L=12 bits. The DAC output (that is, VCO input voltage), defines the VCO output frequency as shown in FIG. 8. VCO 42 is operating with a control input $DAC_{nom}$ which corresponds to the nominal frequency $f_{VCO} = f_{nom}$. Adding a quantity $-DAC_{corr}$ to $DAC_{nom}$ (i.e., $DAC_{VCO} = DAC_{nom} - DAC_{corr}$) results in a decrease in the output frequency, $f_{VCO} = f_{nom} - \Delta f$, whereas adding a quantity $+DAC_{corr}$ to $DAC_{nom}$ (i.e., $DAC_{VCO} = DAC_{nom} + DAC_{corr}$) results in an increase in the output frequency, $f_{VCO} = f_{nom} + \Delta f$. Thus, by appropriately controlling the quantity $DAC_{corr}$ added to $DAC_{nom}$, the output frequency of the VCO $f_{VCO}$ can be controlled accordingly. The mapping function for the PLL 34 with VCO 42 will be described below.

A Phased Locked Loop (PLL) is essentially a feedback control system. Thus, mathematical models (e.g., in the form of transfer functions) of VCO 42 are needed, along with the phase detector 38 to determine the parameters of the loop filter. Due to the discrete nature of the PLL 34, its operations are described by linear difference equations. The z-transform technique is employed to analyze the general tracking (i.e., steady-state) behavior of the PLL 34. Under the steady-state assumption, the phase error samples are small and the general nonlinear difference equation can be approximated by a linear one which can be solved by the z-transform technique. When the PLL 34 has acquired lock and is not pulled out by large phase steps, frequency steps, or phase noise applied to its reference input, its performance can be analyzed by a linear model.

Assuming that the phase error $\theta_e(\theta_e(n)=\theta_s(n)-\theta_{OSC}(n)$ is the difference between the oscillator clock phase $\theta_{OSC}(n)$ and the reference clock phase $\theta_s(n)$) is within a limited range, PLL 34 as a feedback control system can be further simplified as linear feedback control system. This assumption is reasonable for most applications since a real PLL has a bounded and limited locking range (expressed in parts-per-million, ppm, of the nominal operating frequency), outside of which locking cannot be guaranteed. The small signal linear analysis for the PLL 34 is therefore useful for studying steady-state equilibrium behavior and stability properties under these same conditions.

DAC 48 and VCO 42 determine the accuracy of PLL 34. The following variables are defined as follows:

u(n)=DAC output voltage (in volts) at discrete time n, $\Delta V_{DAC}$=DAC output voltage range (which is also the VCO input voltage range)

$DAC_{res}$=DAC range or resolution=$2^L$, where L is the DAC register length in bits, e.g., L=12 bits Thus, given a filtered error value $\tilde{e}(n)$, DAC 48 produces a voltage according to the following formula:

$$u(n) = \frac{\Delta V_{DAC}}{DAC_{res}} \cdot \tilde{e}(n).$$

The above equation means that the VCO input voltage range $\Delta V_{DAC}$ is quantized into $DAC_{res}$ values. It is assumed that the error value $\tilde{e}(n)$ is expressed as an integer number 0 to $DAC_{res}-1$. The z-transform of the expression is given as $$U(z) = \frac{\Delta V_{DAC}}{DAC_{res}} \cdot \tilde{E}(z),$$

from which we get the DAC transfer function $$G_{DAC}(z) = \frac{U(z)}{\tilde{E}(z)} = \frac{\Delta V_{DAC}}{DAC_{res}},$$

and where $\tilde{E}(z)$ and $U(z)$ are the z-transforms of $\tilde{e}(z)$ and $u(z)$, respectively.

Since DAC 48 operates in the discrete-time domain, the combined DAC/VCO operates also in the discrete-time domain. The discrete-time equivalence of the VCO equations is $$\theta_{VCO}(n) = \sum_{i=0}^{n} \Delta\omega(i) = K_{VCO} \sum_{i=0}^{n} u(i)$$

Then denoting $\Theta_{VCO}(z)$ as the z-transform of $\theta_{VCO}(n)$, the z-transform of VCO 42 expression is given by $$\Theta_{VCO}(z) = \frac{z^{-1} K_{VCO}}{1-z^{-1}} U(z),$$

from which we get the transfer function of VCO 42 as $$G_{VCO}(z) = \frac{\Theta_{VCO}(z)}{U(z)} = \frac{z^{-1} K_{VCO}}{1-z^{-1}}.$$

This expression shows that VCO 42 represents a pure integrator for phase signals. The operation of PLL 34 tracks the reference clock and simultaneously rejects short term variations. From a functional point of view, two requirements are specified for a system PLL. On is to provide a very stable clock, synchronized to the external network to run all elements of the system. The other is to provide a stable clock in case synchronization is lost (holdover mode). In this case, the feedback loop is open and the circuit does not behave as a PLL.

The gain of VCO 42 can be computed from the VCO data sheet (typically obtained from the VCO supplier). The first requirement is the determination of the supply voltage(s) of the VCO 42 (this can be determined from the data sheet). For example, the VCO circuit can be powered from a unipolar +5V supply. Let the VCO supply voltage be denoted by $U_{supply}$. The VCO control signal u is usually limited to a range which is smaller than the supply voltage $U_{supply}$. Let $u_{min}$ in and $u_{max}$ be the minimum and maximum value allowed for u, respectively.

VCO 42 is required to generate a frequency $\omega_{VCO\_min}$ when $u(n)=u_{min}$, and the frequency $\omega_{VCO\_max}$ when $u=u_{max}$. The angular frequency is determined at $u=U_{supply}/2$ which corresponds to a frequency $\omega_{nom}$ that is considered as the center frequency of PLL 34, irrespective of the fact that the center frequency could be varying (e.g., due to temperature effects, aging). The VCO gain can be calculated as $$K_{VCO} = \frac{\omega_{VCO\_max} - \omega_{VCO\_min}}{u_{max} - u_{min}} = \frac{\Delta\omega_{VCO}}{\Delta V_{DAC}}.$$

The frequency axis of the VCO characteristics is sometimes expressed in Hertz instead of radians per second. In this case, the gain is obtained as $$K_{VCO} = \frac{2\pi(f_{VCO\_max} - f_{VCO\_min})}{u_{max} - u_{min}} = \frac{2\pi \cdot \Delta f_{VCO}}{\Delta V_{DAC}}.$$

Furthermore, if the frequency axis is expressed in parts-per-million (ppm) of the VCO center frequency, the gain is calculated as $$K_{VCO} = \frac{2\pi \cdot f_{nom} \cdot \Delta ppm}{\Delta V_{DAC}},$$

where $f_{nom}$ is the VCO center frequency and $\Delta ppm$ is the VCO output frequency range in ppm. Note that $\Delta f_{VCO}=f_{nom} \cdot \Delta ppm$.

As an alternate to the above individual DAC and VCO models, a combined DAC/VCO control model is developed. The frequency resolution $f_{res}$ of the VCO can be defined as $$f_{res} = \frac{VCO \text{ frequency range}}{DAC \text{ range}} = \frac{f_{nom} \cdot \Delta \text{ppm}}{DAC_{res}}.$$

The DAC input $DAC_{VCO}$ ($DAC_{VCO} \in [0, DAC_{res}-1]$) can be defined as $$DAC_{VCO}(n) = DAC_{nom} + DAC_{corr}(n)$$

where $DAC_{corr}(n)$ is the DAC/VCO correction factor at discrete time n, and $DAC_{nom}$ is the nominal DAC value (corresponding to the nominal frequency $f_{nom}$). The VCO output frequency sampled at discrete time n can be expressed as $$f_{VCO}(n) = f_{res} DAC_{VCO}(n)$$
$$= f_{res}[DAC_{nom} + DAC_{corr}(n)]$$
$$= f_{nom} + f_{res} DAC_{corr}(n)$$

The above expression corresponds to an angular frequency $$\omega_{VCO}(n) = \omega_{nom} + 2\pi f_{res} DAC_{corr}(n)$$
$$= \omega_{nom} + K_{DAC\_VCO} DAC_{corr}(n),$$
$$= \omega_{nom} + \Delta\omega(n) \text{ where}$$
$$K_{DAC\_VCO} = K_{OSC} = \frac{2\pi \cdot f_{nom} \cdot \Delta \text{ppm}}{DAC_{res}}$$

is the combined DAC-VCO gain. The phase of the VCO $\theta_{VCO}$ is given by the integral over the frequency variation $\Delta\omega(n) = \omega_{VCO}(n) - \omega_{nom}$ as $$\theta_{VCO}(n) = \sum_{i=0}^{n} \Delta\omega(i) = K_{DAC\_VCO} \sum_{i=0}^{n} DAC_{corr}(i),$$

which is consistent with the DAC and VCO models developed earlier on.

$T_{sp}$ can be defined as the nominal time interval between $\hat{S}$ estimation and as the sampling interval of the PLL at the time client. The sampling interval $T_{sp}$ is quantized by the nominal client clock $f_{nom}$ into $M = T_{sp}/t_{nom}$ units, where $t_{nom} = 1/f_{nom}$. That is, computations are made every M PLL clock pulses. The phase detector (PD) 38 operates at the frequency $f_{sp} = 1/T_{sp}$. The interval $T_{sp}$, which is the reference operating interval for measurement and control at the PLL, is equivalent to $2\pi$ radians or M nominal client clock ticks.

The characteristics curve of the PD 38 can be represented in a sawtooth plot of the PD output e versus phase error $\theta_e$ and would cover phase errors greater than $2\pi$ or smaller than $-2\pi$. The curve is periodic with period $2\pi$. The PD output is ideally linear for the entire range of input phase differences from $-2\pi$ to $2\pi$ radian and has maximum output at M, since it assumes steady-state or locked state operations of the PLL, where the linear control system models apply. Note that in the locked state, all frequencies are close to their ideal values. In this state the phase error range $[-2\pi, 2\pi]$ maps to the error range $[-M, M]$.

The slope of the PD characteristic curve is equivalent to the gain of PD 38. The slope is given by $$K_{PD} = \frac{M}{2\pi}.$$

When the phase error is restricted to the range $-2\pi < \theta_e < 2\pi$, the PD output becomes $$e(\theta_e) = \frac{M}{2\pi} \theta_e = K_{PD} \theta_e.$$

The PD 38 measures the phase difference $\theta_e(n) = \theta_s(n) - \theta_{OSC}(n)$ between the time client PLL 34 controlled oscillator phase $\theta_{OSC}(n)$ and the time server (reference) clock phase $\theta_s(n)$ and develops an output e(n) that is proportional to this phase difference $\theta_e(n)$. This operation can be expressed as $$e(n) = K_{PD} \cdot \theta_e(n)$$

The error signal output e(n) is then passed to the loop filter $G_{LF}(z)$ to be processed into the filtered error $\tilde{e}(n)$. The transfer function of the phase detector 38 is given as $$G_{PD}(z) = \frac{E(z)}{\Theta_e(z)} = K_{PD} = \frac{M}{2\pi},$$

where E(z) and $\Theta_e(z)$ are the z-transforms of e(z) and $\theta_e(z)$, respectively.

The error signal e(n) from phase detector 38 is passed to a digital loop filter, the output of which is used to adjust the frequency $f_{OSC}$ of the oscillator. There are many forms of filters that can be used as the loop filter. For example, the digital loop filter could be implemented as a proportional plus integral (PI) filter having transfer function $G_{LF}(z)$ given by $$G_{LF}(z) = \frac{\tilde{E}(z)}{E(z)} = K_1 + \frac{K_2}{1 - z^{-1}},$$

where $\tilde{E}(z)$ is the z-transform of the filter output $\tilde{e}(n)$, and $K_1$ and $K_2$ are the proportional and integral path gains, respectively. This transfer function is equivalent to the discrete-time control equation $$\tilde{e}(n) = \tilde{e}(n-1) + (K_1 + K_2)e(n) - K_1 e(n-1)$$

The loop filter 40 being a PI filter yields a second-order PLL 34. The proportional gain $K_1$ and the integral gain $K_2$ determine the filter response. The filter gains $K_1$ and $K_2$, if required, can be adjusted dynamically on the fly, with greater gain in the startup process for fast locking (acquisition mode) and smaller gain in steady-state for better stability and steady-state error (tracking mode).

Figure 9:
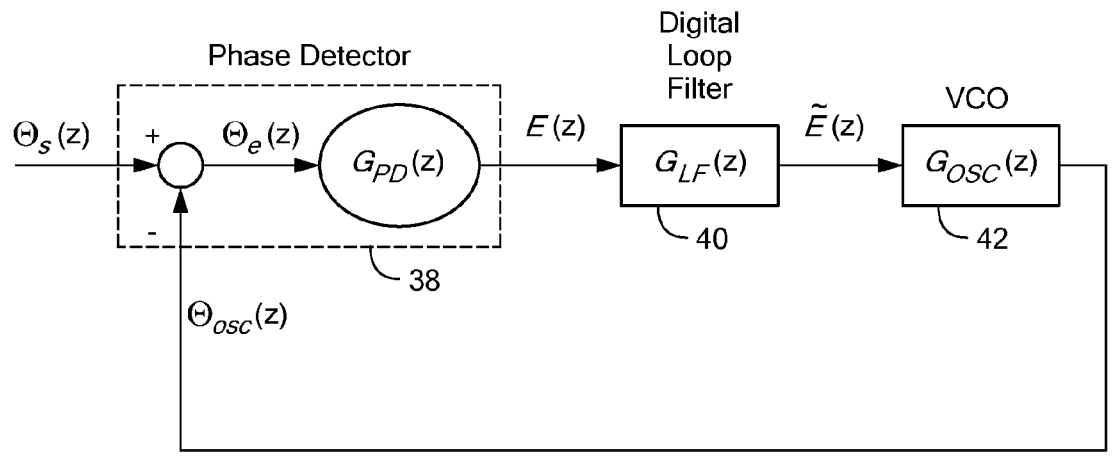
FIG. 9 is a block diagram of a closed-loop control model of the time client PLL in accordance with the principles of the present invention.
Figure 10:
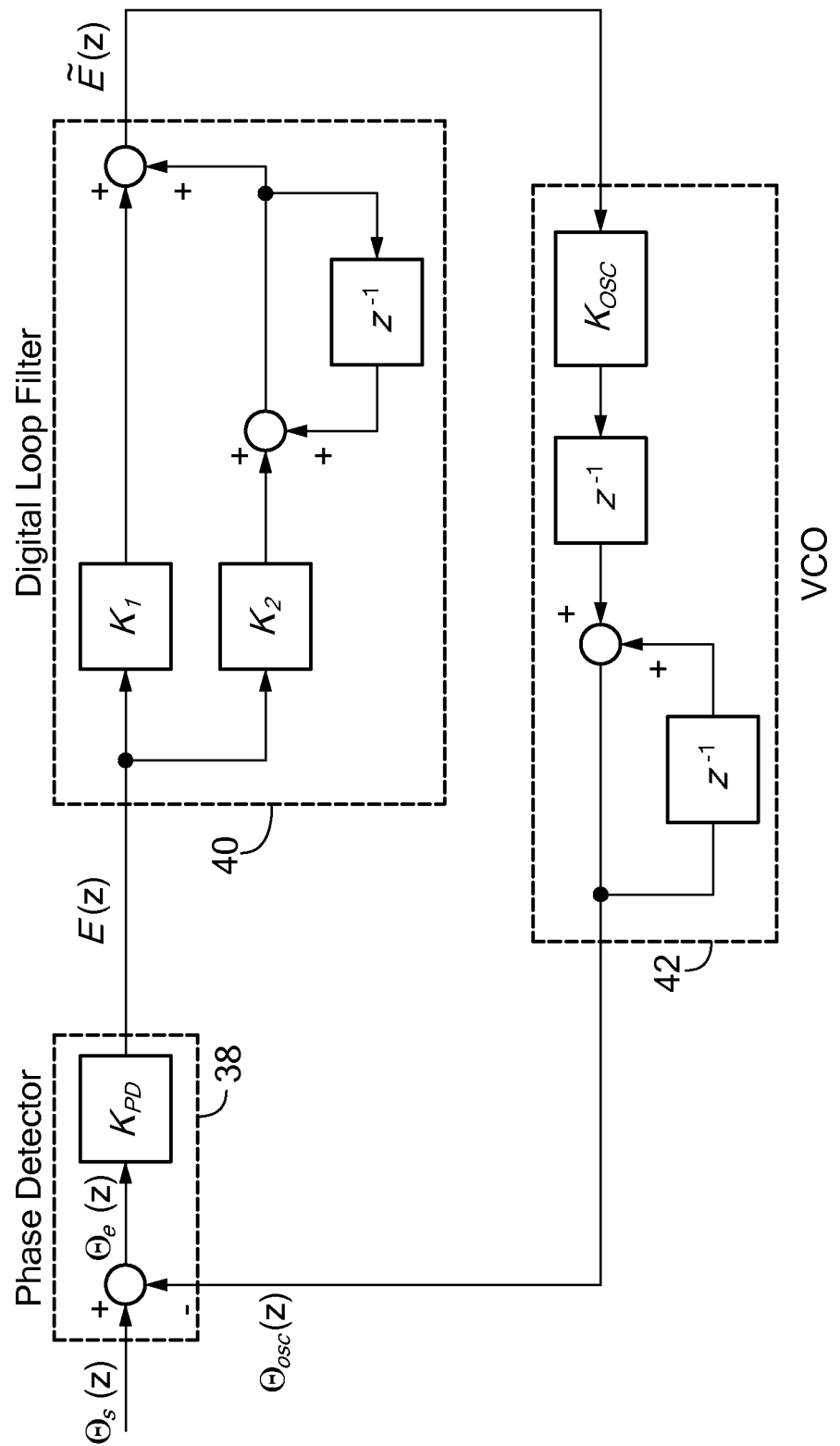
FIG. 10 is another block diagram of the client PLL as a closed-loop system.

FIG. 9 and FIG. 10 are block diagrams illustrating PLL 34 with a well-designed loop filter. PLL 34 can eventually eliminate the phase difference and make the controlled oscillator output phase and frequency lock to the reference. FIG. 9 and FIG. 10 show PLL 34 as a closed-loop feedback control system. The system is a second-order feedback system due to the first-order low-pass filter. The main part of loop filter 40 consists of a proportional path with gain $K_1$ in parallel with an integral path with gain $K_2$.

As a requirement for developing the linear models, we assume that the PLL 34 is in the tracking (steady-state) mode with small phase error about the reference phase. The design is based on the digitization of a continuous-time system whereby the s-plane poles and zeros of a specified differential equation are mapped to the z-plane poles and zeros of a corresponding difference equation using the matched pole-zero (MPZ) method. PLL 34 utilizes the sampled-data representation of the signal throughout the loop. This approach lends itself to implementations using digital signal processing technology. The critical parameters of PLL 34 are specified and their influence on loop performance is noted.

Figure 11:
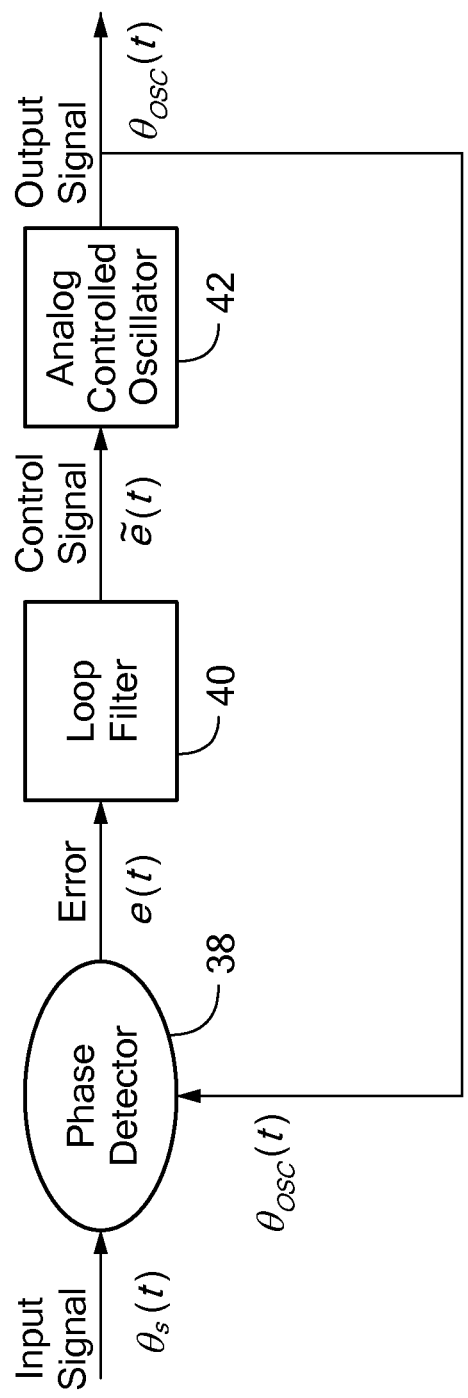
FIG. 11 is a block diagram of an analog PLL used in accordance with the present invention.

FIG. 11 is a block diagram of an analog PLL 34 used in accordance with the present invention. The analog or continuous-time PLL 34 consists of a phase detector 38, a loop filter 40 and VCO 42. Phase detector 38 can simply be represented by a constant gain $K_{PD}$. VCO 42 can be modeled as a perfect integrator in the Laplace domain as $G_{VCO}(s) = K_{VCO}/s$, where $K_{VCO}$ is its gain. Loop filter 40 can be specified in Laplace domain as $F(s)$. In the absence of noise, the closed-loop transfer function and normalized phase error response are specified in the Laplace domain, respectively, as $$H(s) = \frac{\Theta_{VCO}(s)}{\Theta_s(s)} = \frac{K_{PD}K_{VCO}F(s)}{s + K_{PD}K_{VCO}F(s)},$$

and $$\frac{\Theta_e(s)}{\Theta_s(s)} = \frac{\Theta_s(s) - \Theta_{VCO}(s)}{\Theta_s(s)} = \frac{s}{s + K_{PD}K_{VCO}F(s)} = 1 - H(s),$$

where $\Theta_{VCO}(s)$, $\Theta_s(s)$, and $\Theta_e(s)$ are the Laplace transforms of the VCO phase $\theta_{VCO}(t)$, reference signal phase $\theta_s(t)$, and phase error $\theta_e(t)$, respectively.

The order of the loop is equal to the number of perfect integrators within the loop structure. Since the VCO 42 is modeled as a perfect integrator, the loop is at least of order 1. If the loop filter 40 contains one perfect integrator, then the loop is of order 2. The order of the loop can be shown to greatly influence the steady-state performance of the loop. The steady-state phase error can readily be determined by means of the final value theorem, i.e., $$\lim_{t \to \infty} \theta_e(t) = \lim_{s \to 0} s\Theta_e(s) = \lim_{s \to 0} \frac{s^2 \Theta_s(s)}{s + K_{PD}K_{VCO}F(s)}.$$

The steady-state error is defined as the deviation of the VCO phase from the reference after the transient response has died out. The steady-state error is simply $\theta_e(\infty)$. It can be shown that a first-order loop or higher will track an initial phase offset with zero steady-state error. Moreover, a second-order system is required to track a frequency step, while a third-order loop must be employed to track an accelerating phase with zero steady-state error.

A second-order lag-lead filter (also known as a proportional-integral (PI) filter) which has transfer function $$F(s) = \frac{1 + s\tau_2}{s\tau_1},$$

where $\tau_1$ and $\tau_2$ are time constants of the filter is also considered. The filter has a pole at s=0 and therefore behaves like an integrator. It has infinite gain at zero frequency. The closed-loop transfer function of PLL 34 with this filter is obtained by $$H(s) = \frac{2\zeta\omega_n s + \omega_n^2}{s^2 + 2\zeta\omega_n s + \omega_n^2} = \frac{2\zeta\omega_n s + \omega_n^2}{(s - s_0)(s - s_1)},$$

where $\omega_n$ and $\zeta$ are the natural frequency and damping factors, respectively, and are specified in terms of $K_{PD}$, $K_{VCO}$, $\tau_1$ and $\tau_2$ as $$\omega_n = \sqrt{\frac{K_{PD}K_{VCO}}{\tau_1}},$$

$$\zeta = \frac{\omega_n \tau_2}{2}.$$

These two parameters are usually used to specify performance requirements of a system. The poles of the closed loop system are $$s_{0,1} = -\zeta\omega_n \pm j\omega_n\sqrt{1 - \zeta^2}.$$

When $\zeta > 1$, the poles are real; and when $\zeta < 1$, the poles are complex and conjugate. When $\zeta = 1$, the poles are repeated and real and the condition is called critical damping. When $\zeta < 1$, the response is underdamped and the poles are complex. The transient response of the closed-loop system is increasingly oscillatory as the poles approach the imaginary axis when $\zeta$ approaches zero. The above model can be directly applied to the PLL in the continuous-time domain. But for systems based on sampled data, discrete-time models have to be used.

A linearized, time-invariant, approximate transfer function for the entire PLL 34 can be derived based on the conditions that nonlinearity of the system quantization is neglected. The z-domain representation of the phase detector 38, loop filter and the controlled oscillator are given, respectively, as $$G_{PD}(z) = K_{PD},$$

$$G_{LF}(z) = K_1 + \frac{K_2}{1 - z^{-1}} = \frac{(K_1 + K_2)z - K_1}{z - 1},$$

$$G_{OSC}(z) = \frac{K_{OSC} z^{-1}}{1 - z^{-1}} = \frac{K_{OSC}}{z - 1}.$$

Using these transfer functions, the closed-loop transfer function of the PLL 34 becomes $$H(z) = \frac{G_{PD}(z)G_{LF}(z)G_{OSC}(z)}{1 + G_{PD}(z)G_{LF}(z)G_{OSC}(z)}, \text{ or}$$

$$H(z) = \frac{K_{PD}K_{OSC}(K_1 + K_2)z - K_{PD}K_{OSC}K_1}{z^2 + [K_{PD}K_{OSC}(K_1 + K_2) - 2]z - (K_{PD}K_{OSC}K_1 - 1)}.$$

The MPZ can be applied to th H(s) to obtain a discrete-time system $H_2(z)$ that is of form (or relates to the discrete transfer function) H(z). From this relationship, closed form expressions for the loop filter gains $K_1$ and $K_2$ can be derived.

In this embodiment, the goal is it to map the system that meets the performance requirements specified by $\omega_n$ and damping factor $\zeta$ to a corresponding model in the z-domain. The MPZ method directly maps the s-plane poles and zeros of an analog system to the corresponding z-plane poles and zeros of a discrete-time system. Here the Modified-MPZ (MMPZ) method is used. The method first maps the s-plane poles and zeros into the z-plane using the relationship, $z = e^{sT_{sp}}$, where $T_{sp}$ is the sampling interval. The poles of H(s) at $s=-\zeta\omega_n+j\omega_n\sqrt{1-\zeta^2}$ will map to a pole of $H_2(z)$ at $e^{T_{sp}(-\zeta\omega_n+j\omega_n\sqrt{1-\zeta^2})}$. The poles of $H(s)$ at $s=-\zeta\omega_n-j\omega_n\sqrt{1-\zeta^2}$ will map to a pole of $H_2(z)$ at $e^{T_{sp}(-\zeta\omega_n-j\omega_n\sqrt{1-\zeta^2})}$. The zero at $s=-\omega_n/2\zeta$ will map to a zero of $H_2(z)$ $e^{-\omega_n T_{sp}/2\zeta}$.

The next steps forms a discrete-time transfer function in z with the poles and zeros determined in the previous step.

$$H_2(z) = \frac{K_{DC}(z - e^{-\omega_n T_{sp}/2\zeta})}{\left(z - e^{T_{sp}(-\omega_n\zeta+j\omega_n\sqrt{1-\zeta^2})}\right)\left(z - e^{T_{sp}(-\omega_n\zeta-j\omega_n\sqrt{1-\zeta^2})}\right)},$$

where $K_{DC}$ is the DC or low-frequency gain of $H_2(z)$.

The next step is to set the DC or low-frequency gain of the discrete-time system $H_2(z)$ equal to that of the continuous-time system $H(s)$. The Final Value Theorem is often used to find the steady state value of a time function given its Laplace transform or z-transform. If there is a function x(t), the theorem states, in the s-domain, that $$\lim_{t \to \infty} x(t) = \lim_{s \to 0} sX(s),$$

where $X(s)$ is the Laplace transform of x(t) and as long as all the poles of sX(s) are in the left half-plane (LHP) of the s-plane. In the z-domain, the theorem states that $$\lim_{k \to \infty} x(kT_{sp}) = \lim_{z \to 1}(1 - z^{-1})X(z),$$

where $X(z)$ is the z-transform of x(t) and if all the poles of $(1-z^{-1})X(z)$ are inside the unit circle. The theorem can also be use to find the DC gain of a system. The DC gain is the ratio of the output of a system to the inputs (input presumed constant) after all transients have decayed. To find the DC gain, we assume there is a unit step input and use the Final Value Theorem to compute the steady state value of the output.

Therefore for a system with transfer function G(s), the DC gain is defined as $$\text{DC gain} = \lim_{s \to 0} sG(s)\frac{1}{s} = \lim_{s \to 0} G(s),$$

and for a system with transfer function G(z), the DC gain is defined as $$\text{DC gain} = \lim_{z \to 1}(1 - z^{-1})G(z)\frac{1}{1-z^{-1}} = \lim_{z \to 1} G(z).$$

The DC gain of H(s) is obtained as $$\lim_{s \to 0} H(s) = 1.$$

Setting the DC gain of $H_2(z)$ to that of H(s) we see that $K_{DC}=1$.

Therefore, the transfer function $H_2(z)$ simplifies to $$H_2(z) = \frac{(z - e^{-\omega_n T_{sp}/2\zeta})}{\left(z - e^{T_{sp}(-\omega_n\zeta+j\omega_n\sqrt{1-\zeta^2})}\right)\left(z - e^{T_{sp}(-\omega_n\zeta-j\omega_n\sqrt{1-\zeta^2})}\right)}.$$

The transfer function $H_2(z)$ can further be expressed as $$H_2(z) = \frac{z - e^{-\omega_n T_{sp}/2\zeta}}{z^2 - 2e^{-\zeta\omega_n T_{sp}}\cos(\omega_n T_{sp}\sqrt{1-\zeta^2})z + e^{-2\zeta\omega_n T_{sp}}}.$$

Comparing the denominators (or characteristic functions) of H(z) and $H_2(z)$, we see that $-K_{PD}K_{OSC}K_1 + 1 = e^{-2\zeta\omega_n T_{sp}}$, or $K_1 = \frac{1}{K_{PD}K_{OSC}}[1 - e^{-2\zeta\omega_n T_{sp}}]$, and $K_{PD}K_{OSC}(K_1 + K_2) - 2 = -2e^{-\zeta\omega_n T_{sp}}\cos(\omega_n T_{sp}\sqrt{1-\zeta^2})$, or $K_2 = \frac{1}{K_{PD}K_{OSC}}[1 + e^{-2\zeta\omega_n T_{sp}} - 2e^{-\zeta\omega_n T_{sp}}\cos(\omega_n T_{sp}\sqrt{1-\zeta^2})]$.

Typically, performance specification for feedback control systems often involves certain requirements associated with the time response of the system. The setting time, $t_{set}$ can be defined as the time it takes for the system transients to decay. For PLL 34, $t_{set}$ is also referred to as the locking time. For the second-order system with $0 \leq \zeta \leq 1$, the setting time (for the system to settle within 1% of the input amplitude) is given by $$t_{set} = \frac{4.6}{\zeta\omega_n}.$$

Thus, for a second-order system, by specifying the settling time, $t_{set}$, and the damping factor (e.g., $\zeta=0.707$), the undamped natural frequency $\omega_n$, and the filter gains $K_1$ and $K_2$ can easily be determined from the above equations.

The long range usefulness of PLL 34 depends on the stability of the system, where a stable system is one which has the ability to recover from effects of impulse-type inputs. For this reason, system stability is considered while determining system performance with respect to other design criteria. The stability of discrete systems is determined by roots of the discrete system characteristic equation $Q(z) = a_n z^n + a_{n-1} z^{n-1} + \ldots + a_1 z + a_0 = 0$.

However, in this case the stability region is defined by the unit circle $|z|=1$. A necessary and sufficient condition for system stability is that all the roots of the characteristic equation have a magnitude less one, that is, be within the unit circle, $|z|<1$. This ensures that the Kronecker delta response decays with time.

One stability criterion for discrete systems is called the Jury test. For this test, the coefficients of the characteristic equation are first arranged in the Jury array:

$$\begin{array}{c|cccccc}
1 & a_0 & a_1 & a_2 & \ldots & \ldots & a_{n-1} & a_n \\
2 & a_n & a_{n-1} & a_{n-2} & \ldots & \ldots & a_1 & a_0 \\
3 & b_0 & b_1 & b_2 & \ldots & \ldots & b_{n-1} \\
4 & b_{n-1} & b_{n-2} & b_{n-3} & \ldots & \ldots & b_0 \\
5 & c_0 & c_1 & c_2 & \ldots & c_{n-2} \\
6 & c_{n-2} & c_{n-3} & c_{n-4} & \ldots & c_0 \\
\vdots & \vdots & \vdots & \vdots \\
2n-5 & r_0 & r_1 & r_2 & r_3 \\
2n-4 & r_3 & r_2 & r_1 & r_0 \\
2n-3 & s_0 & s_1 & s_2
\end{array},$$

where $$b_k = \begin{vmatrix} a_0 & a_{n-k} \\ a_n & a_k \end{vmatrix}, c_k = \begin{vmatrix} b_0 & b_{n-1-k} \\ b_{n-1} & b_k \end{vmatrix},$$

$$s_0 = \begin{vmatrix} r_0 & r_3 \\ r_3 & r_0 \end{vmatrix}, s_1 \begin{vmatrix} r_0 & r_2 \\ r_3 & r_1 \end{vmatrix}, s_2 = \begin{vmatrix} r_0 & r_1 \\ r_3 & r_2 \end{vmatrix}.$$

The first two rows are written using the characteristic equation coefficients and the next two rows are computed using the determinant relationship shown above. The process is continued with each succeeding pair of rows having one less column than the previous pair until row 2n−3 is computed, which only has three entries. The array is then terminated.

The necessary and sufficient condition for the roots of $Q(z)=0$ to have magnitude less than one are:

$Q(1) > 0$ $Q(-1) \begin{cases} > 0 & \text{for } n \text{ even} \\ < 0 & \text{for } n \text{ odd} \end{cases}$ $|a_0| < |a_n|$ $|b_0| > |b_{n-1}|$ $|c_0| > |c_{n-2}|$ $\vdots$ $|r_0| > |r_3|$ $|s_0| > |s_2|$ Note that if the Q(1) or Q(−1) conditions are not satisfied, the system is unstable and is not necessary to construct the array.

For the second-order PLL, the characteristic equation is given by the denominator of H(z), that is, $Q(z) = a_2 z^2 + a_1 z + a_0 = 0$, where $a_2 = 1$ $a_1 = K_{PD} K_{OSC} (K_1 + K_2) - 2$ $a_0 = -K_{PD} K_{OSC} K_1 + 1$ For the second-order system, the necessary and sufficient conditions for stability are $Q(1) > 0$ $Q(-1) > 0$ $|a_0| < |a_2|$ which then result in the following stability limits $0 < K_{PD} K_{OSC} K_1 < 2$ $0 < K_{PD} K_{OSC} K_2 < 4$ from which we get $$0 < K_1 < \frac{2}{K_{PD} K_{OSC}}; 0 < K_2 < \frac{4}{K_{PD} K_{OSC}}.$$

These conditions will assure that no roots of the PLL 34 are on or outside the unit circle.

Once filter gains $K_1$ and $K_2$ are obtained for a given set of performance specifications for a second-order PLL 34 in terms of locking time (or settling time), $t_{set}$, and with the determination of a damping factor (e.g., $\zeta = 0.707$), the following control equation drive the PLL:

$\tilde{e}(n) = \tilde{e}(n-1) + (K_1 + K_2) e(n) - K_1 e(n-1)$.

With $DAC_{corr}(n) = \tilde{e}(n)$, the VCO control input then becomes $DAC_{VCO}(n) = DAC_{nom} + DAC_{corr}(n)$, rounded to the nearest integer. However, some level of mapping can be done to condition the error signal ready for use at the oscillator input.

As discussed above, the measurement and control are carried out at the sampling frequency $f_{sp}$ which gives, essentially, the sampling period $T_{sp} = 1/f_{sp}$ for the client PLL 34. The errors e(n) from the phase detector 38 are generated at this frequency $f_{sp}$. However, the controlled oscillator operates at the nominal frequency $f_{nom}$. Also, we note that the loop filter parameters derived above are based on the sampling frequency $f_{sp}$. Thus, the error values generated at the lower frequency $f_{sp}$ have to be scaled to appropriate values so that they can be applied to the controlled oscillator which operates at the nominal frequency $f_{nom}$.

The present invention incorporates a mapping function 46 for mapping the filtered error values generated by the loop filter 40 (which operates at the (lower) nominal frequency $f_{sp}$) into appropriate values for the controlling the oscillator (which operates at the (higher) nominal frequency $f_{nom}$).

$DAC_{VCO}(f_{sp}, n)$ represents the VCO control input at time n computed based on system parameters at the nominal sampling frequency $f_{sp}$. $DAC_{VCO}(f_{nom}, n)$ represents the VCO control input at time n computed based on system parameters at the nominal frequency $f_{nom}$. Thus, we have $$f_{vco}(f_{nom}, n) = f_{nom} + f_{res} DAC_{VCO}(f_{nom}, n)$$
$$= M \cdot f_{sp} + f_{res} DAC_{VCO}(f_{nom}, n)$$

from which we get $$f_{VCO}(f_{sp}, n) = \frac{f_{VCO}(f_{nom}, n)}{M}$$
$$= f_{sp} + f_{res} \frac{DAC_{VCO}(f_{nom}, n)}{M}$$

From the above expression we define $$DAC_{VCO}(f_{sp}, n) = \frac{DAC_{VCO}(f_{nom}, n)}{M}.$$

We also define the DAC/VCO operations around the nominal DAC value $DAC_{nom}$ and frequency $f_{nom}$ as $$DAC_{VCO}(f_{nom}, n) = M \cdot DAC_{VCO}(f_{sp}, n)$$
$$= DAC_{nom} + DAC_{corr}(f_{nom}, n)$$

where $DAC_{corr}(f_{nom},n)$ is the DAC correction factor corresponding to the nominal frequency $f_{nom}$, at time n. But we can also define the DAC/VCO operations around the DAC value $DAC_{sp}$ and frequency $f_{sp}$ as $$DAC_{VCO}(f_{sp}, n) = \frac{DAC_{VCO}(f_{nom}, n)}{M}$$
$$= DAC_{sp} + DAC_{corr}(f_{sp}, n)$$

where $DAC_{corr}(f_{sp},n)$ is the DAC correction factor corresponding to the nominal sampling frequency $f_{sp}$, at time n. From the above equation we get $$DAC_{VCO}(f_{nom}, n) = M \cdot DAC_{VCO}(f_{sp}, n)$$
$$= M \cdot DAC_{sp} + M \cdot DAC_{corr}(f_{sp}, n)$$

The two above equations, we see that $$DAC_{nom} = M \cdot DAC_{sp},$$

and $$DAC_{corr}(f_{nom}, n) = M \cdot DAC_{corr}(f_{sp}, n)$$
$$= M \cdot \tilde{e}(f_{sp}, n)$$

where $\tilde{e}(f_{sp},n)$ is the filtered error based on the output of the phase detector 38 which operates at the nominal sampling frequency $f_{sp}$, and obtained from the loop filter 40 whose filter gains are computed based on the same nominal sampling frequency.

The above equation shows that although the correction factor $DAC_{corr}(f_{sp},n)$ was obtained based on the error e(n) and the computed filter gains $K_1$ and $K_2$ (computed from the system parameters and the nominal sampling frequency $f_{sp}$), its corresponding correction factor at $f_{nom}$ (which is the VCO nominal output) can readily be obtained by applying the mapping factor, $MF_{VCO}=M$. Since the DAC 48 takes integer values in the range $DAC_{VCO} \in [0, 2^L-1]$, $DAC_{VCO}$ is rounded to the nearest integer before applying to the DAC 48.

The design of the client PLL 34 involves the following steps:

1. Specify nominal system sampling period, $$T_{sp} = \frac{1}{f_{sp}}$$

(s), settling (locking) time, $t_{set}$(s) (e.g., $1400T_{sp}s$), and damping factor, $\zeta$ (e.g., 0.707) of PLL 2. Compute phase detector Gain:

$$K_{PD} = \frac{M}{2\pi} = \frac{f_{nom}}{2\pi f_{sp}}$$

3. Compute DAC/VCO gain:

$$K_{OSC} = K_{DAC\_VCO} = \frac{2\pi \cdot f_{nom} \cdot \Delta ppm}{DAC_{res}}$$

Note: DAC length, L, $DAC_{res}=2^L$; $\Delta ppm$ are known quantities from the VCO and DAC spec sheet/characteristics 4. Compute natural frequency $$\omega_n = \frac{4.6}{\zeta t_{set}} \text{ (rad/s)}$$

5. Compute proportional gain of loop filter:

$$K_1 = \frac{1}{K_{PD}K_{OSC}}[1 - e^{-2\zeta\omega_n T_{sp}}]$$

6. Compute integral gain of loop filter:

$$K_2 = \frac{1}{K_{PD}K_{OSC}}[1 + e^{-2\zeta\omega_n T_{sp}} - 2e^{-\zeta\omega_n T_s}\cos(\omega_n T_{sp}\sqrt{1-\zeta^2})]$$

7. Are the stability conditions satisfied?

$$0 < K_1 < \frac{2}{K_{PD}K_{OSC}} = K_{1\max}$$

$$0 < K_2 < \frac{4}{K_{PD}K_{OSC}} = K_{2\max}$$

If no, go back to Step 1 and adjust the parameters and continue

8. Is the performance of the system satisfactory (verified through simulations, prototype, measurements, etc.)? If no, go back to Step 1 and adjust the parameters and continue 9. If yes in Steps 7 and 8, then end of time client PLL design.

To reflect common practice in hardware and to simplify implementation, all gain factors can be determined to be negative integer powers of two. The filter gains are restricted to be $2^{-x}$, with x an integer, so that coefficient multiplication is reduced to shifting the binary word.

The methods for timestamp filtering, minimum delay selection and offset estimation at the time client are as follows:
1. After a sampling period $T_{sp}$, select the messages $RQ_i$, i=1,2,..., L, and the $RP_j$, j=1,2,..., L, with min delay:

$$im = \arg\left\{\min_i (T_{2,i} - T_{1,i})\right\}, \quad i = 1, 2, \ldots, L$$

$$jm = \arg\left\{\min_j (T_{4,j} - T_{3,j})\right\}, \quad j = 1, 2, \ldots, L$$

2. Then compute the delay $d_{min}$ and time offset $\theta_{min}$ from:

$$d_{min} = \frac{(T_{2,im} - T_{1,im}) + (T_{4,jm} - T_{3,jm})}{2}$$

$$\theta_{min} = \frac{(T_{2,im} - T_{1,im}) - (T_{4,jm} - T_{3,jm})}{2}$$

3. Pass $d_{min}$ to a change detection algorithm to determine if there is a true min delay change on the route between server and client.
    IF a true min delay change is detected THEN
        set $\hat{\theta}$ value to min delay value $\theta_{min}$ at time of change, discarding all history
    ELSE
        continue filtering the $\theta_{min}$ values to obtain $\hat{\theta}$
4. Then compute estimate of server current time $\hat{S}(L_{clock})$ at client using local hardware clock time $L_{clock}$ and conversion function $$\hat{S}(L_{clock}) = L_{clock} - \hat{\theta}$$

The method for the time client PLL computations is as follows: Load first available time $\hat{S}(L_{clock})$ into PLL clock counter, thereafter the oscillator increments the counter; wait for the next sampling period, then compute the current time $\hat{S}$.

The PLL method including the mapping function is described as follows:
1. Subtract the current reading of the PLL clock counter $\hat{C}$ from $\hat{S}$ to obtain the PLL error signal $e = \hat{S} - \hat{C}$
    Note the time between $d_{min}$ and $\theta_{min}$ estimation is defined as the sampling period of the system which has a nominal value of $T_{sp} = 1/f_{sp}$, where $f_{sp}$ is the sampling frequency. This is design parameter set and is a down-sampled value of the rate of protocol transactions (i.e., how often the time client requests for time updates from the time server). The nominal sampling period $T_{sp} = 1/f_{sp}$ is only used in the PLL design process to obtain the design parameters for the loop filter.
2. Filter the error signal $e = \hat{S} - \hat{C}$ using the loop filter to obtain the filtered signal error as follows:

$$\tilde{e}(n) = \tilde{e}(n-1) + (K_1 + K_2)e(n) - K_1 e(n-1)$$

3. Use the mapping function to map the filtered error from the (lower) nominal sampling frequency $f_{sp}$ domain into the (higher) nominal frequency domain of the oscillator $f_{nom}$:

$$\tilde{e}_{mp}(n) = DAC_{corr}(n) = M \cdot \tilde{e}(n)$$

4. Use the mapped filtered error $\tilde{e}_{mp}(n)$ as a correction factor to modify the value of the nominal oscillator control word to obtain the oscillator control input:

$$DAC_{VCO}(n) = \max\{0, \min[DAC_{nom} + DAC_{corr}(n), 2^L - 1]\}$$

5. Wait for the next sampling period and then go to Algorithm 1

The present invention can be realized in hardware, software, or a combination of hardware and software. An implementation of the method and system of the present invention can be realized in a centralized fashion in one computing system or in a distributed fashion where different elements are spread across several interconnected computing systems. Any kind of computing system, or other apparatus adapted for carrying out the methods described herein, is suited to perform the functions described herein.

A typical combination of hardware and software could be a specialized or general-purpose computer system having one or more processing elements and a computer program stored on a storage medium that, when loaded and executed, controls the computer system such that it carries out the methods described herein. The present invention can also be embedded in a computer program product, which comprises all the features enabling the implementation of the methods described herein, and which, when loaded in a computing system is able to carry out these methods. Storage medium refers to any volatile or non-volatile storage device.

Computer program or application in the present context means any expression, in any language, code or notation, of a set of instructions intended to cause a system having an information processing capability to perform a particular function either directly or after either or both of the following a) conversion to another language, code or notation; b) reproduction in a different material form. In addition, unless mention was made above to the contrary, it should be noted that all of the accompanying drawings are not to scale. Significantly, this invention can be embodied in other specific forms without departing from the spirit or essential attributes thereof, and accordingly, reference should be made to the following claims, rather than to the foregoing specification, as indicating the scope of the invention.

It will be appreciated by persons skilled in the art that the present invention is not limited to what has been particularly shown and described herein above. In addition, unless mention was made above to the contrary, it should be noted that all of the accompanying drawings are not to scale. A variety of modifications and variations are possible in light of the above teachings without departing from the scope and spirit of the invention, which is limited only by the following claims.

What is claimed is:
1. A timing system for time synchronization over a packet network, the timing system comprising:
    a time server having a server clock, the time server generating current timestamp information;
    a time client having a client clock, the time client having a phase-locked loop driven client clock counter, the time client configured to periodically exchange time transfer protocol messages with the time server over the packet network, the time client further including a protocol engine, the protocol engine configured to:
        receive the timestamp information from the time server with each time transfer protocol message exchange;
        calculate a current clock offset between the client clock and the server clock; and
        calculate an estimated server time using the current clock offset; and
    a phase-locked loop configured to receive a signal representing the estimated server time, the phase-locked loop further configured to determine the estimated client current time based on a difference between the estimated server time and a time indicated by client clock counter.

2. The timing system of claim 1, wherein the estimated server time is recalculated after each exchange of the time transfer protocol messages.

3. The timing system of claim 2 wherein the phase-locked loop includes a phase detector, wherein the phase detector is configured to periodically produce an error signal upon each recalculation of the estimated server time, the error signal representing the difference between the recalculated estimated server time and the time indicated by the client clock counter.

4. The timing system of claim 3, wherein the phased-locked loop includes an oscillator, the oscillator controlled by the error signal, wherein an output of the oscillator provides a clock frequency for the client clock counter.

5. The timing system of claim 4, wherein the client clock counter represents a current time of the client, the client clock counter being updated after each change in time of the time server.

6. The timing system of claim 4, wherein the error signal reduces to a given error range, the given error range indicating time synchronization between the estimated server time and the estimated client time.

7. The timing system of claim 1, wherein each time client has a local current time, the local current time transmitted to the time server in each time transfer protocol message.

8. The timing system of claim 7, wherein the local current time is provided by a local hardware clock in the time client.

9. The timing system of claim 1, wherein a time transfer protocol message transmitted from the time server to the time client includes:
   a first time stamp denoting a time that a request is sent from the time client to the time server;
   a second time stamp denoting a time that the request is received at the time server; and
   a third time stamp denoting a time when the time transfer protocol message is transmitted from the time server to the time client.

10. A method of time synchronization over a packet network between a time server having a server clock and a time client having a client clock, the time client having a phase-locked loop driven client clock counter, the method comprising:
   transmitting a request message to the time server, the request message having a first time stamp denoting a time at which the request message is sent;
   receiving a transfer protocol message from the time server over a packet network, the received transfer protocol message having the first time stamp, a second time stamp denoting a time at which the first time stamp was received at the time server, and a third time stamp denoting a time at which the transfer protocol message was sent from the time server;
   estimating a current clock offset between the client clock and the server clock based on the timestamps included in the transfer protocol message and a fourth time stamp denoting a time at which the transfer protocol message was received at the time client;
   periodically calculating an estimated server time based on the current clock offset; and
   calculating an estimated client time based on the estimated server time.

11. The method of claim 10, further comprising recalculating the estimated server time after each receipt of a time transfer protocol message.

12. The method of claim 11, wherein upon each recalculation of the estimated server time, further comprising computing an error signal, the error signal representing the difference between the recalculated estimated server time and the time indicated by the client clock counter.

13. The method of claim 12, further comprising transforming the error signal into a control signal for driving an oscillator, the oscillator providing a clock frequency for the client clock counter.

14. The method of claim 13, wherein the error signal reduces to a given error range, the given error range indicating synchronization between the estimated server time and the estimated client time.

15. A timing system for time synchronization over a packet network, the timing system comprising:
   a time server configured to generate timestamp information, the time server having a server clock; and
   a timing transfer node in communication with the time server, the timing transfer node configured to transmit the timestamp information in the form of time transfer protocol messages to one or more time clients over the packet network, the one or more time clients each having a client clock, the time stamp information transmitted to one or more clients being used to estimate a current clock offset between the client clock and the server clock;
   the time transfer protocol messages being periodically exchanged between the time server and the one or more time clients according to a time transfer protocol, the time transfer protocol determining an estimated server time based upon the timestamp information.

16. The timing system of claim 15, wherein the current clock offset is incorporated into a computation of the estimated time reference at the time server.

17. The timing system of claim 16, wherein the estimated server time is recalculated after each exchange of the time transfer protocol messages.

* * * * *